(12) United States Patent
Gambino et al.

(10) Patent No.: US 8,299,475 B2
(45) Date of Patent: Oct. 30, 2012

(54) INTERLEVEL CONDUCTIVE LIGHT SHIELD

(75) Inventors: Jeffrey P. Gambino, Westford, VT (US);
Zhong-Xiang He, Essex Junction, VT (US); Kevin N. Ogg, Burlington, VT (US); Richard J. Rassel, Colchester, VT (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/408,141

(22) Filed: Feb. 29, 2012

(65) Prior Publication Data
US 2012/0161299 A1 Jun. 28, 2012

Related U.S. Application Data

(62) Division of application No. 12/133,380, filed on Jun. 5, 2008, now Pat. No. 8,158,988.

(51) Int. Cl.
*H01L 27/15* (2006.01)
*H01L 29/267* (2006.01)
*H01L 31/12* (2006.01)
*H01L 33/00* (2010.01)
*G06F 17/50* (2006.01)

(52) U.S. Cl. ............. 257/81; 257/99; 257/100; 716/119

(58) Field of Classification Search .................... 257/81, 257/99, 100; 716/119
See application file for complete search history.

(56) References Cited

U.S. PATENT DOCUMENTS

| | | |
|---|---|---|
| 6,188,093 B1 | 2/2001 | Isogai et al. |
| 7,202,543 B2 | 4/2007 | Cole |
| 2002/0018278 A1 | 2/2002 | Sato |
| 2004/0141077 A1 | 7/2004 | Ohkawa |
| 2005/0248675 A1 | 11/2005 | Hashimoto et al. |
| 2006/0011808 A1 | 1/2006 | Li et al. |

OTHER PUBLICATIONS

International Search Report dated Jul. 27, 2009 issued in corresponding International Application No. PCT/US09/46188.

*Primary Examiner* — Jenny L Wagner
(74) *Attorney, Agent, or Firm* — Scully, Scott, Murphy & Presser, P.C.; Anthony J. Canale

(57) ABSTRACT

A CMOS image sensor pixel includes a conductive light shield, which is located between a first dielectric layer and a second dielectric layer. At least one via extends from a top surface of the second dielectric layer to a bottom surface of the first dielectric layer is formed in the metal interconnect structure. The conductive light shield may be formed within a contact level between a top surface of a semiconductor substrate and a first metal line level, or may be formed in any metal interconnect via level between two metal line levels. The inventive CMOS image sensor pixel enables reduction of noise in the signal stored in the floating drain.

13 Claims, 12 Drawing Sheets

INTERLEVEL CONDUCTIVE LIGHT SHIELD

CROSS REFERENCE TO RELATED APPLICATION

This application is a divisional of U.S. patent application Ser. No. 12/133,380, filed Jun. 5, 2008 and is related to co-pending U.S. application Ser. No. 12/133,379, filed Jun. 5, 2008 the entire content and disclosure of which is incorporated herein by reference.

FIELD OF THE INVENTION

The present invention relates to semiconductor structures incorporating a conductive light shield, and design structures for the same.

BACKGROUND OF THE INVENTION

A pixel sensor includes an array of pixel sensor cells that detects two dimensional signals. Pixel sensors include image sensors, which may convert a visual image to digital data that may be represented by a picture, i.e., an image frame. The pixel sensor cells are unit devices for the conversion of the two dimensional signals, which may be a visual image, into the digital data. A common type of pixel sensors includes image sensors employed in digital cameras and optical imaging devices. Such image sensors include charge-coupled devices (CCDs) or complementary metal oxide semiconductor (CMOS) image sensors.

While complementary metal oxide semiconductor (CMOS) image sensors have been more recently developed compared to the CCDs, CMOS image sensors provide an advantage of lower power consumption, smaller size, and faster data processing than CCDs as well as direct digital output that is not available in CCDs. Also, CMOS image sensors have lower manufacturing cost compared with the CCDs since many standard semiconductor manufacturing processes may be employed to manufacture CMOS image sensors. For these reasons, commercial employment of CMOS image sensors has been steadily increasing in recent years.

Referring to FIG. 1, an exemplary prior art semiconductor circuit comprising an image sensor pixel is shown. The exemplary prior art semiconductor circuit comprises a photosensitive diode PD, a global shutter transistor GS, a transfer gate transistor TG, a reset gate transistor RG, a source follower transistor SF, and a row select transistor RS. One end of the photosensitive diode PD is grounded, while the other end of the photosensitive diode PD is directly connected to the source of the global shutter transistor GS, which is herein referred to as a global shutter transistor source, and to the source of the transfer gate transistor TG, which is herein referred to as a transfer gate transistor source. The drain of the transfer gate transistor TG, which is herein referred to as a transfer gate transistor drain, constitutes a floating diffusion FD, which is electrically floating while the transfer gate transistor TG and the reset gate transistor are turned off. The floating diffusion FD is directly connected to the source of the reset gate transistor RG, which is herein referred to a reset gate transistor source, and to the gate of the source follower transistor SF, which is herein referred to the source follower transistor gate. While the floating diffusion FD is typically implemented as the drain of the transfer gate transistor TG, the floating diffusion FD may alternately implemented as the source of the reset gate transistor in a physical device.

The source of the source follower transistor SF is directly connected to the drain of the row select transistor RS, which is herein referred to as a row select transistor drain. The source of the row select transistor RS, which is herein referred to as a row select transistor source, is a "data out" node, or the node at which the output of the image sensor pixel. The drain of the reset gate transistor RG, the drain of the global shutter transistor GS, and the drain of the source follower are connected to a power supply voltage Vdd.

The exemplary prior art semiconductor circuit may be employed to form an array of image sensors to capture an image. Such an array of image sensors may be employed in any optical, infrared, or ultraviolet imaging device including digital cameras. Each image sensor unit is referred to as a pixel. The operation of the array of the image sensors includes an exposure sequence and a readout sequence. The exposure sequence may be performed simultaneously employing the global shutter method. The readout sequence is performed row by row, i.e., the time for performing the readout sequence varies from row to row. Thus, the hold time between the exposure sequence and the readout sequence varies from row to row.

During the exposure sequence, the amount of light impinging on the photosensitive diode PD is quantified by the amount of charge that accumulates in the floating drain node FD. All image sensor pixels in the entire array are exposed to photons that impinging thereupon at the same time for the same duration through the operation of a global shutter circuit. The photons are schematically represented by wavy arrows labeled "h."

Initially, the global shutter control signal "gsc" turns on the global shutter transistor GS, which resets the photosensitive diode PD to a pinning voltage. The same global shutter control signal "gsc" is applied to all other global shutter transistors in an image sensor. The global shutter control signal "gsc" is then changed to turn off the global shutter transistor GS. At this step, the same global shutter control signal "gsc" is applied to all other global shutter transistors in the image sensor. All photosensitive diodes in the image sensor, including the photosensitive diode PD in FIG. 1, are exposed to impinging lights and generate charges. The electrical charges generated by the photosensitive diode PD continue to be accumulated on the node of the photosensitive diode PD tied to the global shutter transistor GS and the transfer gate transistor TG.

The reset gate RG is turned on by a reset gate control signal "rgc" so that the voltage level of the floating drain node FD is reset. The same reset gate control signal "rgc" is applied to all other reset gate transistors in the image sensor. Normally, the voltage at the floating drain node FD becomes substantially the same as the system power supply voltage Vdd. The reset gate RG is then turned on by a change in the reset gate control signal "rgc." The same reset gate control signal "gsc" is applied to all other reset gate transistors to turn off all reset gate transistors in the image sensor. Since the floating drain node FD is floating, the voltage at the floating drain node FD remains at the same voltage before the reset gate transistor RG is turned off. The transfer gate TG is turned on by a transfer gate control signal "tgc," which ends exposure of the photosensitive diode PD and integration of electrical charges in the photosensitive diode PD. The charged collected up to that point in the photosensitive diode is transferred through the transfer gate transistor TG to the floating drain node FD. The same transfer gate control signal "tgc" is applied to all other transfer gate transistors to transfer collected charges from each photosensitive diode to a corresponding floating drain node through a transfer gate transistor. The transfer gate transistor TG and all other transfer gate transistors in the image sensor are turned by a change in the transfer gate control signal "tgc."

The readout sequence is performed row by row by selecting a row to be read out sequentially from the first row to the last row. The row select transistors in each row are controlled by a common row selection signal "rsc." Thus, there may be as many independent common row selection signals as the number of rows. Once a row is selected, all row selection transistors RS in the selected row are turned on. The shift of the voltage at a floating drain node FD from the system power supply voltage Vdd is proportional to the amount of photons that the corresponding photosensitive diode PD generates, which is proportional to the amount of light impinging on the photosensitive diode PD. The voltage on the data out node of each pixel is read out in each column. The voltage level provides a first quantity related to the amount of electrical charge that the photosensitive diode PD generated.

The reset gate transistors are thereafter turned on for the selected row. This allows the readout of a second quantity, which is a background level signal for each pixel in the row. By subtracting the second quantity from the first quantity, any circuit related offset to the current measurement that generated the first quantity is compensated, i.e., any circuit specific contributions to the image data from the image sensor are eliminated.

However, there is a small amount of leakage of charge from the floating drain node FD to the substrate, through the transfer gate transistor TG, and the reset gate transistor RG since leakage current paths are present in almost every device. In practical terms, the most significant leakage is typically the leakage through the reset gate transistor. Such a leakage alters the voltage at the floating drain node FD during the hold time between the exposure sequence and the readout sequence. The greater the leakage, the greater the shift in the voltage during the hold time, and consequently, the greater the degree of image degradation from the array of the image sensor pixels.

The noise in the signal of an image sensor pixel increases with the hold time of the charge in the floating drain node FD. Thus, the noise due to leakage becomes a serious challenge in a global shutter method, which is employed in many CMOS image sensors to enable capture of images of high speed objects. The global shutter method employs a global shutter operation, in which the image for the whole frame is captured in the light conversion units of the pixels at the exact same time for all the rows and columns. The signal in each light conversion unit is then transferred to a corresponding floating diffusion. The voltage at the floating diffusions is read out of the imager array on a row-by-row basis. The global shutter method enables image capture of high speed subjects without image artifacts, but introduces a concern with the global shutter efficiency of the pixel since the integrity of the signal may be compromised by any charge leakage from the floating diffusion between the time of the image capture and the time of the reading of the imager array.

The image signal is held at the floating drain for varying amounts of time in the global shutter method. For example, the signal from the first row may have the least wait time which corresponds to the time needed to read out a single row, while the signal from the last row has the greatest wait time which almost corresponds to the full frame read-out time, during which the charge on the floating diffusion may be degraded due to charge leakage or charge generation. Any charge generations or charge leakage that occurs on the floating diffusion during the wait time can have a significant impact to the quality of the signal that is read out of the imager.

A metric of the efficiency in preserving the initial charge in the pixel is "global shutter efficiency," which is the ratio of a signal that is actually read out of the pixel to the signal that would have been read out immediately after the signal was captured by the pixel. Ideally, the signal read out should be exactly the same as the signal captured, i.e., the global shutter efficiency should be 1.0 in an ideal CMOS image sensor. In practice, this is not the case due to the charge leakage and/or charge generation, and the picture quality is correspondingly degraded.

Since the floating diffusion of a transfer gate transistor typically consists of a p-n junction, any incident photons can generate additional charges on this node by photogeneration, which alters the charge signal being held at this node. The incident photons thus act as a source of noise for the signal held at the floating diffusion. In order to prevent the incident light from reaching the floating diffusion, current designs for an image sensor pixel employs interconnect level metal wiring formed above a via level as a light shield that blocks the incoming photons. The wiring of the metal interconnect level thus becomes restrictive to accommodate the light shield. Further, the light shield needs to be as close as possible to the floating diffusion in order to minimize the angles of incident photons that may be able to reach the floating diffusion from a glancing angle. In some cases, adding a light shield with accompanying changes to interconnect wiring structures may require increasing the wiring channels, which can adversely degrade the effective fill factor of the image sensor pixel used for light collection, or may add unnecessary capacitance to the floating diffusion.

In view of the above, there exists a need for a CMOS image sensor pixel structure that provides effective shielding of a floating diffusion without restrictions in metal wiring in metal interconnect levels, and a design structure for the same.

Further, there exists a need for a CMOS image sensor pixel structure that provides greater angular coverage of the floating drain without adversely affecting metal wiring in metal interconnect levels, and a design structure for the same.

Yet further, there exists a need for a CMOS image sensor pixel structure that does not require any increase in wiring channels while providing an effective blockage of light over the floating drain, and a design structure for the same.

SUMMARY OF THE INVENTION

To address the needs described above, the present invention provides a CMOS image sensor pixel having a conductive light shield formed within a via level of metal interconnect structure, and a design structure for the same.

In the present invention, a CMOS image sensor pixel includes a conductive light shield, which is located between a first dielectric layer and a second dielectric layer. At least one via extends from a top surface of the second dielectric layer to a bottom surface of the first dielectric layer is formed in the metal interconnect structure. The conductive light shield may be formed within a contact level between a top surface of a semiconductor substrate and a first metal line level, or may be formed in any metal interconnect via level between two metal line levels. The inventive CMOS image sensor pixel enables reduction of noise in the signal stored in the floating drain.

Further, a design structure for designing, manufacturing, or testing a design for a CMOS image sensor pixel including a conductive light shield over a floating drain of an image sensor pixel is provided. The design structure includes data for the conductive light shield, which is designed to be located between a first dielectric layer and a second dielectric layer. At least one via extends from a top surface of the second dielectric layer to a bottom surface of the first dielectric layer is formed in the metal interconnect structure. The conductive light shield may be formed within a contact level between a top surface of a semiconductor substrate and a first metal line level, or may be formed in any metal interconnect via level between two metal line levels. The inventive design structure enables reduction of noise in the signal stored in the floating drain.

According to an aspect of the present invention, a semiconductor structure is provided, which comprises:

at least one semiconductor device located on a top surface of a semiconductor substrate;

a conductive light shield located over the at least one semiconductor device and disjoined from at least one node of the at least one semiconductor device;

at least one metal line located above a top surface of the conductive light shield; and a contact via abutting a bottom surface of the at least one metal line and a top surface of the at least one semiconductor device.

In one embodiment, the contact via is of integral construction without any physically manifested interface therein.

In another embodiment, the semiconductor structure further comprises:

a dielectric substrate-capping layer abutting a top surface of the semiconductor substrate and located underneath a portion of the conductive light shield; and a middle-of-line (MOL) dielectric layer located over the dielectric substrate-capping layer and located underneath the at least one metal line.

According to another aspect of the present invention, another semiconductor structure is provided, which comprises:

at least one semiconductor device located on a top surface of a semiconductor substrate;

at least one first-level metal line separated from a top surface of the semiconductor substrate;

a first dielectric layer abutting a top surface of the at least one first-level metal line;

a conductive light shield located over the at least one semiconductor device and abutting a top surface of the first dielectric layer; and a second dielectric layer located over the conductive light shield, wherein the first dielectric layer and the second dielectric layer encapsulate an entirety of the conductive light shield.

In one embodiment, the semiconductor structure further comprises:

a second level metal line embedded in the second dielectric layer; and a contact via abutting a bottom surface of the at least one second level metal line and a top surface of the at least one first level metal line.

In another embodiment, the semiconductor structure further comprises:

a metal plate having a same material composition and a same thickness as the conductive light shield and abutting the top surface of the first dielectric layer and disjoined from the conductive light shield; and another contact via abutting a bottom surface of another second level metal line and a top surface of the metal plate.

According to yet another aspect of the present invention, a design structure embodied in a machine readable medium for designing, manufacturing, or testing a design is provided. The design structure comprises:

a first data representing a semiconductor device on a semiconductor substrate;

a second data representing a conductive light shield located in a local interconnect level and overlying the semiconductor device;

a third data representing a metal line located in a metal interconnect level which is located above the local interconnect level; and a fourth data representing a contact via abutting the metal line and the semiconductor device.

In one embodiment, the contact via is of integral construction without any physically manifested interface therein.

In another embodiment, the design structure further comprises:

a fifth data representing a dielectric substrate-capping layer abutting a top surface of the semiconductor substrate and located underneath a portion of the conductive light shield; and a sixth data representing a middle-of-line (MOL) dielectric layer located over the dielectric substrate-capping layer and located underneath the at least one metal line.

In even another embodiment, the design structure further comprises another data representing a middle-of-line (MOL) dielectric liner layer abutting a top surface of the dielectric substrate-capping layer and a non-planar bottom surface of the conductive light shield.

In yet another embodiment, the sixth data comprises:

a seventh data representing a lower middle-of-line (MOL) dielectric layer directly adjoining a bottom surface of the conductive light shield, wherein a top surface of the lower MOL dielectric layer is coplanar with a top surface of the conductive light shield; and an eighth data representing upper middle-of-line (MOL) dielectric layer abutting a bottom surface of the at least one metal line and abutting a top surface of the lower middle-of-line (MOL) dielectric layer.

In still another embodiment, the design structure further comprises another data representing another contact via abutting a top surface of the conductive light shield and another bottom surface of the at least one metal line.

In still yet another embodiment, the second data includes another data representing at least one downward-protruding via portion abutting one of the at least one semiconductor device, wherein an entirety of the conductive light shield including the at least one downward-protruding via portion is of a same composition and of integral construction without any physically manifested interface therein, and wherein the at least one downward-protruding via portion is laterally surrounded by the dielectric substrate-capping layer.

In a further embodiment, the design structure comprises a netlist.

In an even further embodiment, the design structure resides on storage medium as a data format used for exchange of layout data of integrated circuits.

In a yet further embodiment, the semiconductor device includes a floating drain of a transfer transistor of an image sensor pixel.

According to still another aspect of the present invention, another design structure embodied in a machine readable medium for designing, manufacturing, or testing a design is provided. The design structure comprises:

a first data representing a semiconductor device located on a top surface of a semiconductor substrate;

a second data representing a first-level metal line separated from a top surface of the semiconductor substrate;

a third data representing a first dielectric layer abutting a top surface of the at least one first-level metal line;

a fourth data representing a conductive light shield located over the at least one semiconductor device and abutting a top surface of the first dielectric layer; and a fifth data representing a second dielectric layer located over the conductive light shield, wherein the first dielectric layer and the second dielectric layer encapsulate an entirety of the conductive light shield.

In one embodiment, the design structure further comprises:

a sixth data representing a second-level metal line embedded in the second dielectric layer; and a seventh data representing a contact via abutting a bottom surface of the at least one second-level metal line and a top surface of the at least one first level metal line.

In another embodiment, the contact via is of integral construction without any physically manifested interface therein.

In even another embodiment, the design structure further comprises:

an eighth data representing a metal plate having a same material composition and a same thickness as the conductive light shield and abutting the top surface of the first dielectric layer and disjoined from the conductive light shield; and a ninth data representing another contact via abutting a bottom surface of another second-level metal line and a top surface of the metal plate.

In yet another embodiment, the design structure further comprises another data representing yet another contact via abutting a bottom surface of another second-level metal line and the top surface of the metal plate.

In still another embodiment, the design structure further comprises:

a tenth data representing a first metal plate having a same material composition as, and a same thickness as, the conductive light shield and abutting the top surface of the dielectric layer and disjoined from the conductive light shield;

an eleventh data representing a first dielectric portion abutting a top surface of the conductive light shield having sidewalls substantially vertically coincident with sidewalls of the conductive light shield;

a twelfth data representing a second dielectric portion having a same material composition as, and a same thickness as, the first dielectric portion, abutting a top surface of the first metal plate, and disjoined from the first dielectric portion; and a thirteenth data representing a second metal plate abutting a top surface of the second dielectric portion.

In a further embodiment, the design structure comprises a netlist.

In an even further embodiment, the design structure resides on storage medium as a data format used for exchange of layout data of integrated circuits.

In a yet further embodiment, the semiconductor device includes a floating drain of a transfer transistor of an image sensor pixel.

In a still further embodiment, the fourth data includes another data representing at least one downward-protruding via portion located within the conductive light shield, wherein the at least one downward-protruding via portion vertically abuts a conductive structure such as a source region, a drain region, or a gate of a field effect transistor.

In a still yet further embodiment, the design structure comprises another data representing at least one metal-light-shield-contacting via which abut a top surface of the conductive light shield.

DETAILED DESCRIPTION OF THE INVENTION

Figure 1:
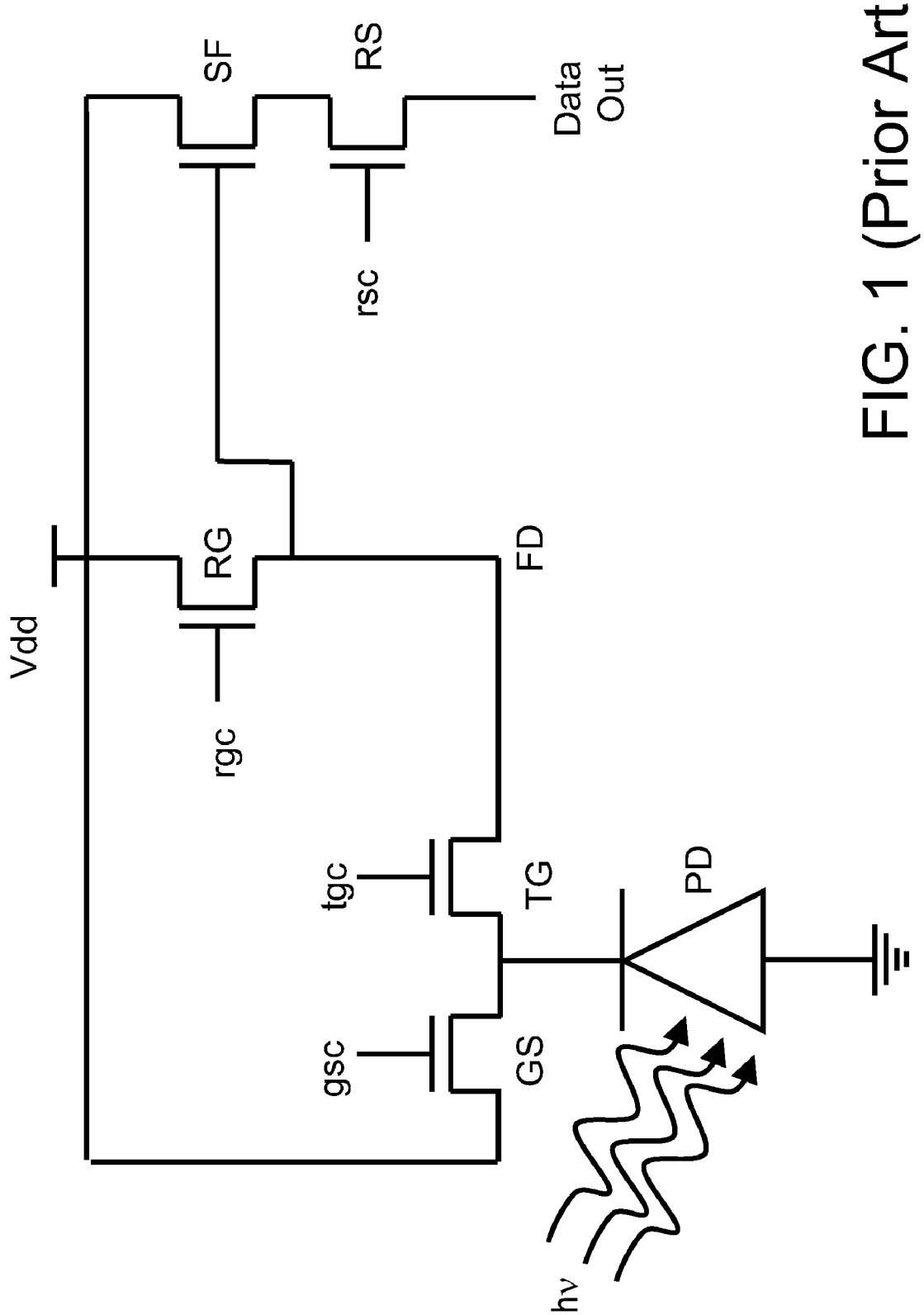
FIG. 1 is an exemplary prior art exemplary semiconductor circuit for a complementary metal-oxide-semiconductor (CMOS) image sensor pixel.

As stated above, the present invention relates to semiconductor structures incorporating a conductive light shield, and design structures for the same, which are now described in detail with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

As stated above, the present invention relates to semiconductor structures incorporating a conductive light shield, and methods of manufacturing the same. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Figure 2:
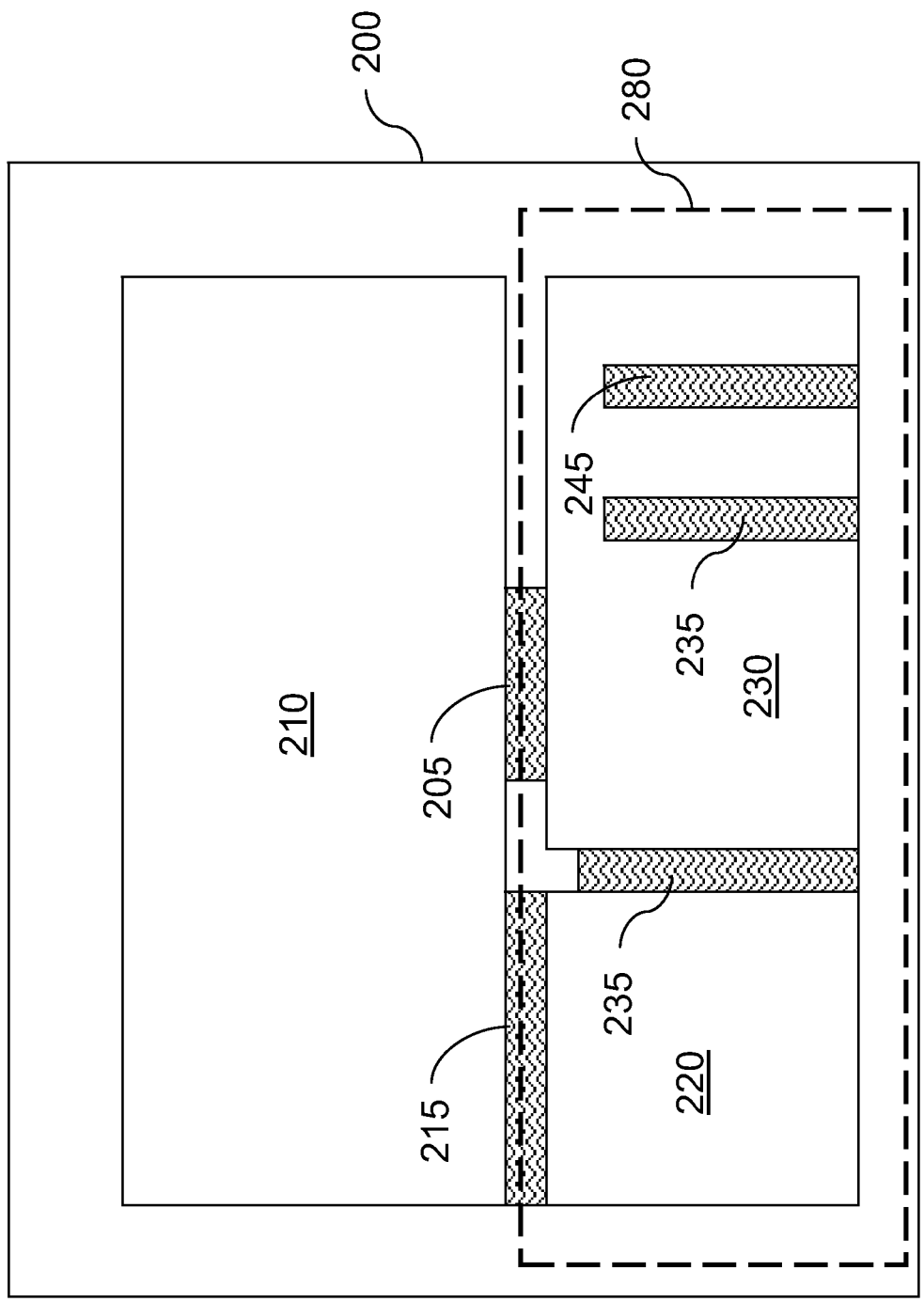
FIG. 2 is an exemplary layout for a semiconductor circuit comprising a conductive light shield of the present invention, in which the area of the light shield 280 is represented by a dotted rectangle.

Referring to FIG. 2, an exemplary layout for a semiconductor circuit according to the present invention comprises a unit image sensor pixel 200, which includes a photosensitive diode 210, a floating drain 220, and an active area portion 230. The active area portion 230 contains source and drain regions for a global reset transistor (not explicitly shown), a reset gate transistor (not explicitly shown), a source follower transistor (not explicitly shown), and a row select transistor (not explicitly shown). A transfer transistor gate line 215 is located between the photosensitive diode 210 and the floating drain 220. A reset gate transistor gate line 235 is located between the floating drain and the active area portion 230. A global shutter gate line 205 is located between the active area portion and the photosensitive diode 210. A source follower gate line 235 and a row select gate line 245 are located in the active area portion 230. A light shield 280, represented by a dotted rectangle, covers the area of the floating drain 220. Not necessarily but preferably, the light shield 280 also covers the area of the active area region 230. The light shield 280 blocks light so that photogeneration process is suppressed in the floating drain 220 and the active area portion 230. Suppression of photogeneration of charge carriers in the floating drain 220 reduces noise to the signal held in the form of a stored charge in the floating drain 220. Further, suppression of photogeneration of charge carriers in the active area portion 230 enhances signal fidelity during sensing of the stored charge by the transistors in the active area portion 230 by lowering the background level noise in the operation of the transistors.

Figure 3:
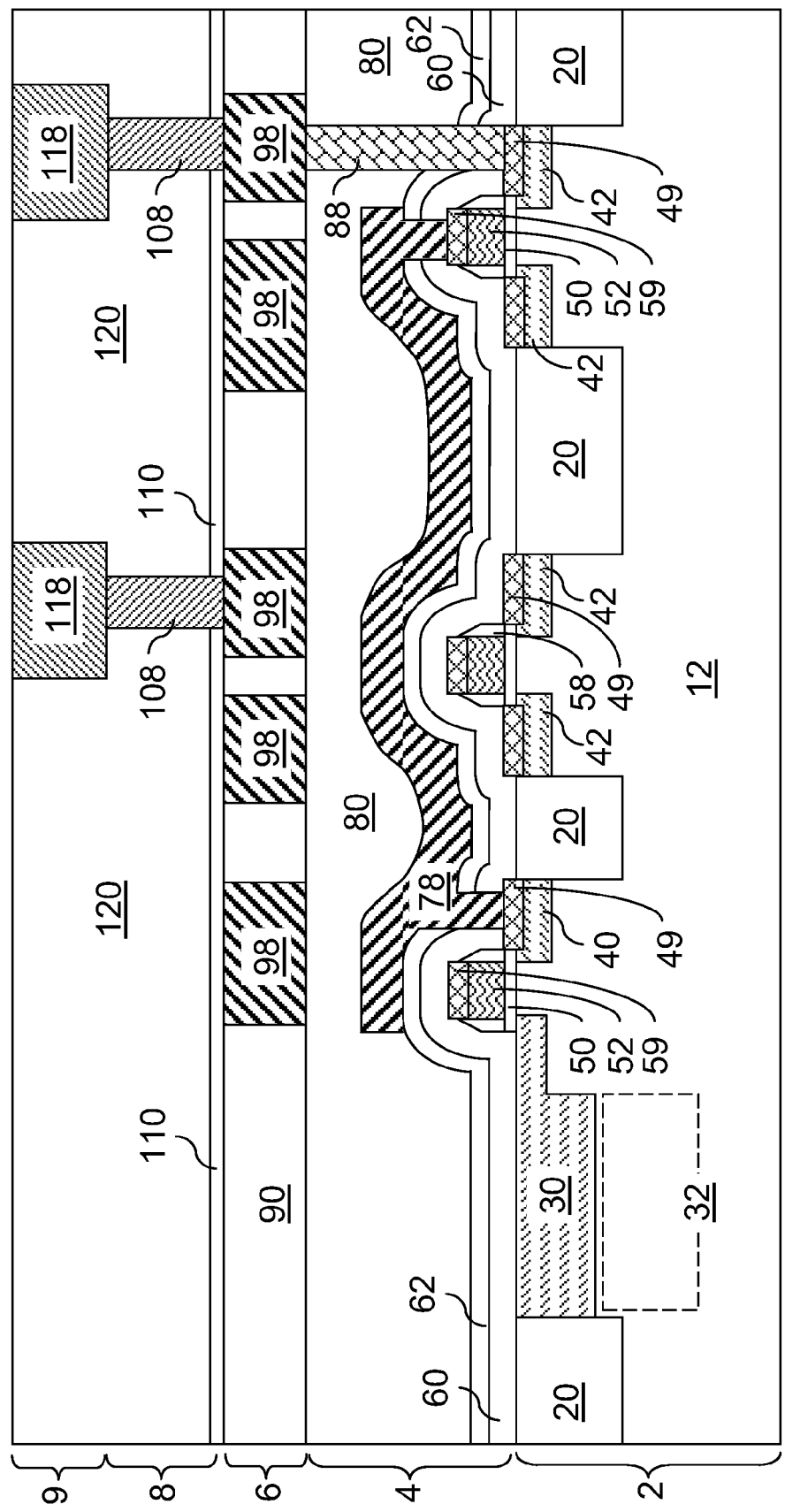
FIG. 3 is a vertical cross-sectional view of a first exemplary semiconductor structure according to a first embodiment of the present invention.

Referring to FIG. 3, a first exemplary semiconductor structure according to a first embodiment of the present invention comprises a semiconductor substrate 2, a substrate contact via level interconnect structure 4, a first metal line level interconnect structure 6, a first back-end-of-line (BEOL) via level interconnect structure 8, and a second metal line level interconnect structure 9, which may be employed as a unit image sensor pixel 200 of FIG. 2.

The semiconductor substrate 2 comprises a semiconductor layer 12 having a doping of a first conductivity type, shallow trench isolation structures 20, a second conductivity type charge collection well 30, a floating drain 40, and source and drain regions 42 of field effect transistors, which may include a global reset transistor, a reset gate transistor, a source follower transistor, and a row select transistor. The semiconductor layer 12 includes a portion located directly underneath the second conductivity type charge collection well 30, which is referred to as a first conductivity type semiconductor region 32. The second conductivity type is the opposite of the first conductivity type. For example, the first conductivity type may be p-type and the second conductivity type may be n-type, or vice versa. Some or all of the source and drain regions 42 may have a doping of the second conductivity type and be formed directly on the semiconductor layer 12. Also, some or all of the source and drain regions 42 may have a doping of the first conductivity type and be formed in a second conductivity type well (not shown) containing the source and drain regions 42 of the first conductivity type, as known in the art.

Non-limiting examples of the semiconductor material that may constitute the semiconductor substrate 2 include silicon, a silicon germanium alloy portion, silicon, germanium, a silicon-germanium alloy portion, a silicon carbon alloy portion, a silicon-germanium-carbon alloy portion, gallium arsenide, indium arsenide, indium gallium arsenide, indium phosphide, lead sulfide, other III-V compound semiconductor materials, and II-VI compound semiconductor materials. For example, silicon may be employed for the semiconductor material of the semiconductor layer 12, the second conductivity type charge collection well 30, the floating drain 40, and/or the source and drain regions 42 of the field effect transistors. Preferably, the semiconductor layer 12 is single crystalline, i.e., the semiconductor material is epitaxially aligned atomically within the entirety of the semiconductor layer 12. More preferably, the entirety of the semiconductor substrate 20 less the shallow trench isolation structures 20 is single crystalline, i.e., the semiconductor material is epitaxially aligned atomically within the entirety of the semiconductor layer 12, the second conductivity type charge collection well 30, the floating drain 40, and/or the source and drain regions 42 of the field effect transistors.

The shallow trench isolation structure 20 is formed, for example, by formation of a dielectric pad layer (not shown) over the semiconductor substrate 2, application and lithographic patterning of a photoresist (not shown), an anisotropic etch that transfers the pattern in the photoresist into exposed portions of the semiconductor layer 12 to form a shallow trench, deposition of a dielectric material inside the shallow trench, and planarization of the dielectric material. The depth of the shallow trench isolation structure 20 may be from about 150 nm to about 600 nm, and typically from about 200 nm to about 500 nm, although lesser and greater thicknesses are also contemplated herein.

The first conductivity type semiconductor region 32 is a portion of the semiconductor layer 12, and typically has the same dopant concentration as the rest of the semiconductor layer 12. The thickness of the first conductivity type semiconductor region 32 depends on the thickness of the semiconductor layer 12 as measured underneath the gate dielectric 50 and the depth of the second conductivity type charge collection well 30, and may be from about 500 nm to about 5,000 nm, and typically from about 1,000 nm to about 3,000 nm.

The floating drain 40 has a doping of the second conductivity type, and is electrically floating when the transfer transistor, which comprises the second conductivity type charge collection well 30, the floating drain 40, and a gate and a channel therebetween, is turned off to enable storage of electrical charges. Preferably, separate implantation masks are employed to independently control the depth of the second conductivity type charge collection well 30 and the depth of the floating drain 40. Preferably, the depth of the floating drain 40 is less than the depth of the second conductivity type charge collection well 30. The dopant concentration of the floating drain 40 may be from about $1.0 \times 10^{17}/cm^3$ to about $1.0 \times 10^{21}/cm^3$, and typically from about $1.0 \times 10^{18}/cm^3$ to about $1.0 \times 10^{20}/cm^3$, although lesser and greater dopant concentrations are also explicitly contemplated herein. The depth of the floating drain 40, as measured between the top surface of the semiconductor substrate 2 and a flat portion of the bottom surface of the floating drain 40, may be from about 30 nm to about 300 nm, and typically from about 60 nm to about 300 nm, although lesser and greater depths are also contemplated herein.

The first conductivity type semiconductor region 32 and the second conductivity type charge collection well 30 collectively constitute a photodiode (32, 30) that generates electron-hole pairs. Charge carriers of the second conductivity type are collected in the second conductivity type charge collection well 30 in proportion to the amount of photons impinging into the photodiode (32, 30). In case the first conductivity type is p-type and the second conductivity type is n-type, electrons are collected in the second conductivity type charge collection well 30. In case the second conductivity type is n-type and the second conductivity type is p-type, holes are collected in the second conductivity type charge collection well 30. A photon impinging on the photodiode (32, 30) generates an electron-hole pair if the photon interacts with the semiconductor material in the photodiode (32, 30). The energy of the photon that induces electron-hole pair generation depends on the type of the semiconductor material in the semiconductor substrate 2, but the wavelength range of photons for the photogeneration of an electron-hole pair is from about 190 nm to about 1,100 nm for silicon, from about 400 nm to about 1,700 nm for germanium, and from about 800 nm to about 2,600 nm for indium gallium arsenide, respectively.

If the electron-hole pair is generated within the depletion region of the photodiode (32, 30), the charge carriers (holes and electrons) drift apart due to the kinetic energy imparted to the charge carriers during the photogeneration process. If a minority carrier (a charge carrier of the first conductivity type in the second conductivity type charge collection well 30 or a charge carrier of the second conductivity type in the first conductivity type semiconductor region 32) enters into the depletion region by drifting, the electric field inherent in the depletion region of the photodiode (32, 30) sweeps the carrier across the p-n junction, which then becomes a majority carrier, i.e., a charge carrier of the first conductivity type in the first conductivity type semiconductor region 32 or a charge carrier of the second conductivity type in the second conductivity type charge collection well 30, upon crossing the p-n junction, and producing a photocurrent if the circuit is closed, or accumulates charges. Particularly, if the carrier is a carrier of the second conductivity type, the carrier accumulates in the second conductivity type charge collection well 30. The amount of charge that accumulates in the second conductivity type charge collection well 30 is nearly linear to the number of incident photons (assuming the photons have the same energy distribution). If the minority carrier recombines with the majority carriers within the photodiode (32, 30) prior to entering the depletion region, the minority carrier is "lost" through recombination and no current or charge accumulation results.

The transfer gate transistor is integrally formed with the photodiode (30, 32) such that the second conductivity type charge collection well 30, which comprises a heavily-doped second conductivity type semiconductor material, is also a source of the transfer gate transistor. Charge carriers of the second conductivity type, i.e., electrons if the second conductivity type is n-type or holes if the second conductivity type is p-type, accumulate in the second conductivity type charge collection well 30 when photons are incident on the photodiode (32,30). When the transfer transistor is turned on, the charge carriers in the second conductivity type charge collection well 30 are transferred into the floating drain 40, which is a charge collection well and stores electrical charge from the photodiode (30, 32) as data until a read circuit detects the amount of stored charge. Thus, the second conductivity type charge collection well 30 functions as the source of the transfer transistor while the transfer transistor is turned on.

The transfer transistor and other transistors of the first exemplary semiconductor structure comprise gate dielectrics 50, gate electrodes 52, dielectric gate spacers 58, gate metal semiconductor alloy regions 59, and source and drain metal semiconductor alloys regions 49. The gate dielectrics may comprise a semiconductor oxide base dielectric material such as silicon oxide or silicon oxynitride, or may comprise a high-k material containing a metal and oxygen, and is known in the art as high-k gate dielectric materials. The gate electrode 52 may comprise a doped semiconductor material such as doped polysilicon or a doped silicon-germanium alloy, and/or may comprise a metallic material employed in a metal gate. The gate metal semiconductor alloy regions 59 and source and drain metal semiconductor alloys regions 49 may be formed by reacting a metal with the semiconductor material of the source and drain regions 42, the floating drain 40, and/or the gate electrode 52.

A dielectric substrate-capping layer 60 is formed directly on the top surface of the semiconductor substrate 2, the dielectric gate spacers 58, the gate metal semiconductor alloy regions 59, and the source and drain metal semiconductor alloys regions 49. The dielectric substrate-capping layer 60 comprises a dielectric material such as a dielectric oxide, a dielectric nitride, or a dielectric nitride. For example, the dielectric substrate-capping layer 60 may comprise silicon nitride. The dielectric substrate-capping layer 60 may apply a tensile stress or a compressive to the semiconductor substrate 8 and gate structures underneath.

The dielectric substrate-capping layer 60 may be formed by low pressure chemical vapor deposition (LPCVD), rapid thermal chemical vapor deposition (RTCVD), plasma enhanced chemical vapor deposition (PECVD), high density plasma chemical vapor deposition (HDPCVD), etc. The thickness of the dielectric substrate-capping layer 60 may be from about 10 nm to about 150 nm, and typically from about 25 nm to about 75 nm, although lesser and greater thicknesses are also contemplated herein.

A middle-of-line (MOL) dielectric liner 62 is formed on the dielectric substrate-capping layer 60. The MOL dielectric liner 62 may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. The thickness of the MOL dielectric liner 62 may be from about 10 nm to about 200 nm. Alternately, the MOL dielectric liner 62 may comprise an organosilicate glass (OSG) or another low-k dielectric material having a dielectric constant value of less than 2.8. The MOL dielectric liner 62 may be formed by a conformal deposition or a non-conformal deposition. The MOL dielectric liner layer 62 abuts a top surface of the dielectric substrate-capping layer 60.

A photoresist (not shown) is applied over the MOL dielectric liner 62 and lithographically patterned with holes overlying at least one node of the underlying semiconductor devices including the transfer transistor and other transistors. The pattern in the photoresist is transferred into the MOL dielectric liner 62 and the dielectric substrate-capping layer 60 to form at lease one via hole extending to a node of a semiconductor device on the semiconductor substrate 2. The nodes of the semiconductor devices on the semiconductor substrate 8 are selectively exposed, i.e., at least one node is exposed and at least another node is not exposed, so that only nodes to be electrically connected are exposed at the bottom of the at lease one via hole. For example, a via hole may be formed to expose a drain metal semiconductor alloy region 49 directly on the floating drain and another via hole may be formed to expose a gate metal semiconductor alloy region 59 directly on a gate electrode 52 of a source follower transistor of a unit image sensor pixel.

An opaque conductive layer (not shown) is deposited by methods known in the art, including chemical vapor deposition (CVD), physical vapor deposition (PVD), atomic layer deposition (ALD) etc. The opaque conductive layer may comprise a metallic material, and may comprise W, Ti, Ta, TiN, TaN, WN, or an alloy or a combination thereof. Alternately, the opaque conductive layer may comprise a doped semiconductor material such as doped polysilicon, a doped silicon germanium alloy, etc. The opaque conductive layer fills all of the at least one via holes in the MOL dielectric liner 62 and the dielectric substrate-capping layer 60. The opaque conductive layer is lithographically patterned to form a conductive light shield 78, which, for example, covers the floating drain 40 and other transistors except the area of a photosensitive diode (30, 32). The area covered by the conductive light shield 78 corresponds to the area of the light shield 280 in FIG. 2.

The conductive light shield 78 comprises at least one downward-protruding via portion abutting a semiconductor device and providing contact to the semiconductor device. The entirety of the conductive light shield 78 including the at least one downward-protruding via portion may have the same material composition. The entirety of the conductive light shield 78 including the at least one downward-protruding via portion may be of integral construction without any physically manifested interface therein. The at least one downward-protruding via portion is laterally surrounded by the MOL dielectric liner 62 and the dielectric substrate-capping layer 60.

The bottom surface of the conductive light shield 78 abuts the top surface of the MOL dielectric liner 62, which is non-planar. The contour of the bottom surface of the conductive light shield 78 follows the contour of the MOL dielectric liner 62, and is also non-planar. Particularly, the conductive light shield 78 may include at least two bottom surface portions separated from the semiconductor substrate 8 by different distances. The conductive light shield 78 may have a non-planar top surface that follows the contour of the bottom surface of the conductive light shield 78. The thickness of the conductive light shield 78, as measured at a flat portion of the conductive light shield 78, may be from about 10 nm to about 200 nm, and typically from about 40 nm to about 120 nm, although lesser and greater thicknesses are also contemplated herein.

The conductive light shield 78, due to its proximity to the top surface of the semiconductor substrate 2, blocks incident light over a large spherical angle as measured from the floating drain 40 and/or the various transistors in the sensing circuit, thereby suppressing photogeneration of charges in the floating drain 40 and the various transistors of the first exemplary semiconductor structure, which may be the transistors of a unit image sensor pixel. The conductive light shield 78 is a local wiring level that enables wiring only over the area covered by the conductive light shield 78. The conductive light shield 78 is regionally confined, e.g., within the area of the unit image sensor pixel, and does not enable global interconnection across the region, e.g., outside the area of the unit image sensor pixel.

A middle-of-line (MOL) dielectric layer 80 is formed on the conductive light shield 78 and the exposed portions of the MOL dielectric liner 62. The MOL dielectric layer 80 may comprise a CVD oxide, an organosilicate glass (OSG), or another low-k material having a dielectric constant value of less than 2.8 described above. The MOL dielectric layer 80 may be formed by a conformal deposition or a non-conformal deposition. Preferably, the MOL dielectric layer 80 is planarized employing chemical mechanical planarization (CMP). Alternately, the MOL dielectric layer 80 may comprise a self-planarizing material such as spin-on-glass (SOG) or a spin-on low-k dielectric material having a dielectric constant less than 2.8. The thickness of the MOL dielectric layer 80, either after planarization or deposition as a self-planarizing layer, is sufficient to cover the entirety of the top surface of the conductive light shield 78. Preferably, the top surface of the MOL dielectric layer 80 is separated from the highest portion(s) of the top surface of the conductive light shield 78 by a distance to prevent any dielectric breakdown through the MOL dielectric layer 80. Preferably, the distance is greater than 20 nm, and preferably greater than 100 nm. The MOL dielectric layer 80 is of integral construction without a physically manifested interface therein. The MOL dielectric layer 80 directly adjoins a bottom surface of the conductive light shield 78 at the bottom of the sidewalls of the conductive light shield 78.

A photoresist (not shown) is applied over the MOL dielectric layer 80 and is lithographically patterned to form at least one hole. The pattern in the photoresist is transferred through the MOL dielectric layer 80, the MOL dielectric liner 62, and the dielectric substrate-capping layer 60 to expose a node of a semiconductor device on the semiconductor substrate 8. The photoresist is removed selective to the MOL dielectric layer 80. A metal is deposited on the exposed surfaces of the MOL dielectric layer 80 and on all surfaces in the at least one hole including exposed surfaces of the semiconductor device. The portion of the deposited metal above the top surface of the MOL dielectric layer 80 is removed by planarization, recess etch, or a combination thereof. The remaining portions of the deposited metal in the at least one hole constitutes at least one contact via 88, which extends from a top surface of the MOL dielectric layer 80 through the MOL dielectric layer 80, the MOL dielectric liner 62, and the dielectric substrate-capping layer 60 onto a top surface of a semiconductor device on the semiconductor substrate 8. For example, the at least one contact via 88 may contact a top surface of one of source and drain metal semiconductor alloy regions 49.

Each of the at least one contact via 88 may be formed by a single deposition step without exposure to air. Thus, each of the at least one contact via 88 is of integral construction without any physically manifested interface therein. Each of the at least one contact via 88 has a top surface that is coplanar with a top surface of the MOL dielectric layer 80 and a bottom surface that is coplanar with a bottom surface of the dielectric substrate-capping layer 60. The at least one contact via 88 comprises a metallic material such as W, Ta, Ti, WN, TaN, and TiN.

A first metal line level dielectric layer 90 is formed on the MOL dielectric layer 80 by methods known in the art including chemical vapor deposition and spin-on deposition. The first metal line level dielectric layer 90 is typically called "M1" level dielectric layer. The first metal line level is a global interconnect level that enables wiring across the entirety a semiconductor chip. First metal line level troughs are lithographically patterned in the first metal line level dielectric layer 90 and filled with metal to form first metal lines 98. The first metal lines 98 may comprise, for example, Cu or Al. The first metal lines 98 and the first metal line level dielectric layer 90 collectively constitute the first metal line level interconnect structure 6. A top surface of each of the at least one contact via 88 vertically abuts a bottom surface of one of the first metal lines 98. The conductive light shield 78 is located beneath the first metal line level interconnect structure 6. The MOL dielectric layer 80 abuts a bottom surface of the first metal lines 78.

A back-end-of-line dielectric capping layer 110 and a second level dielectric layer 120 are formed over the first metal line level interconnect structure 6 by methods known in the art including chemical vapor deposition and spin-on deposition. Second level via holes are formed in the back-end-of-line dielectric capping layer 110 and a lower portion of the second level dielectric layer 120. Second level line troughs overlying the second level via holes are formed in an upper portion of the second level dielectric layer 120. Metal fills the second level via holes and the second level line troughs by deposition such as a combination of physical vapor deposition and plating. The deposited metal is planarized by chemical mechanical planarization (CMP), recess etch, or a combination thereof to form second level vias 108 and second metal lines 118. The second level vias 108 and the second metal lines 118 may comprise, for example, Cu or Al.

The back-end-of-line dielectric capping layer 110, the lower portion of the second level dielectric layer 120, and the second level vias 108 collectively constitute the first back-end-of-line (BEOL) via level interconnect structure 8. The upper portion of the second level dielectric layer 120 and the second metal lines 118 collectively constitute the second metal line level interconnect structure 9. Additional via level interconnect structures (not shown) and additional metal line level interconnect structures may be formed as needed.

Figure 4:
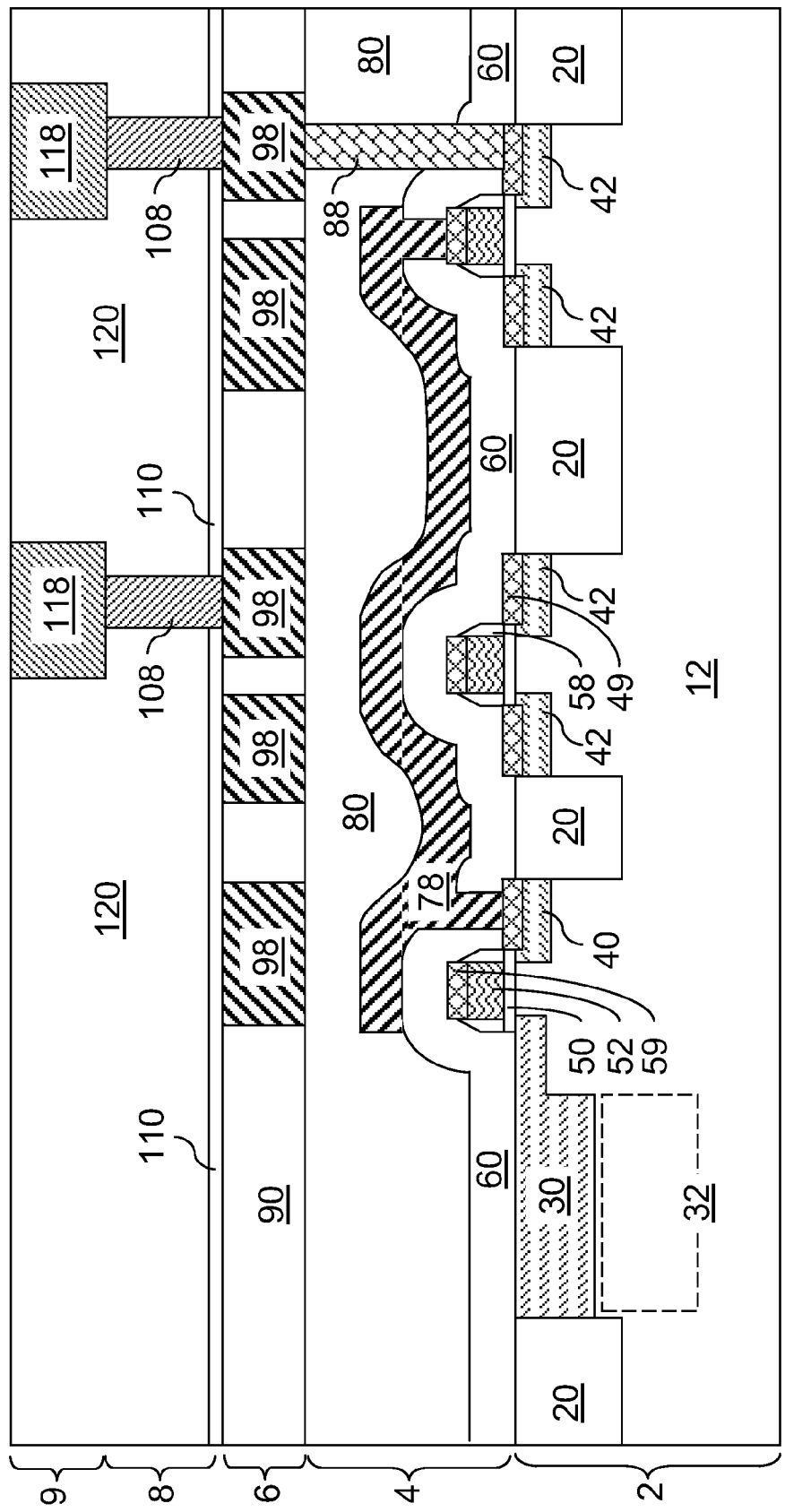
FIG. 4 is a vertical cross-sectional view of a variation on the first exemplary semiconductor structure according to the first embodiment of the present invention.

Referring to FIG. 4, a variation of the first exemplary semiconductor structure is shown, in which a conductive light shield 78 is formed directly on a dielectric substrate-capping layer 60. Further, the MOL dielectric layer 80 is formed directly on the top surface of the conductive light shield 78 and on the top surface of the dielectric substrate-capping layer 60. In other words, a MOL dielectric liner 62 of the first exemplary semiconductor structure of FIG. 3 is omitted in this variation of the first exemplary semiconductor structure.

The MOL dielectric layer 80 is located over the dielectric substrate-capping layer 60 and underneath the first metal lines 98. The conductive light shield 78 comprises at least one downward-protruding via portion abutting a semiconductor device. The at least one downward-protruding via portion of the conductive light shield 78 is laterally surrounded by the dielectric substrate-capping layer 60. The bottom surface of the conductive light shield 78 is non-planar and abuts the top surface of the dielectric substrate-capping layer 60.

Figure 5:
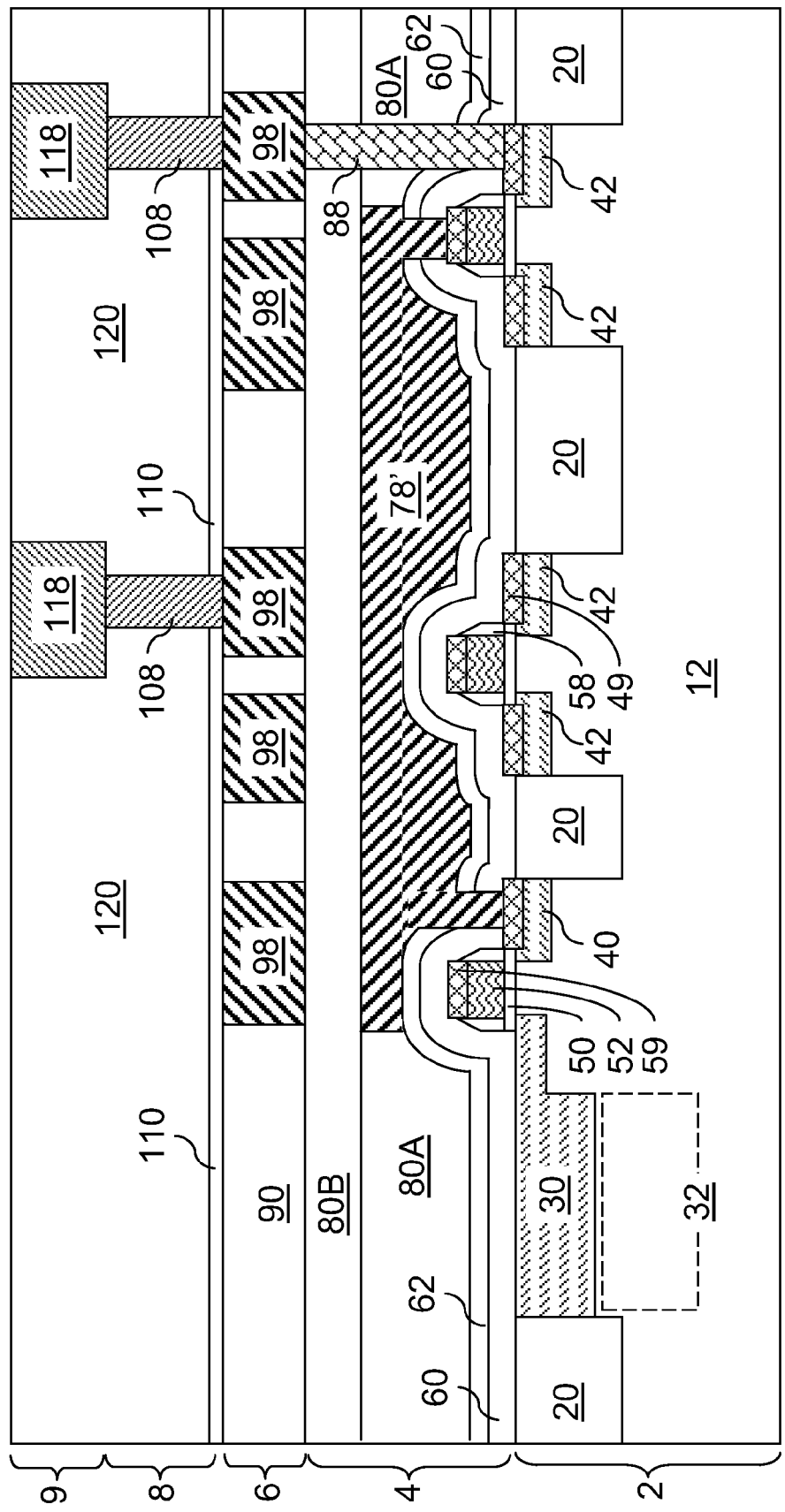
FIG. 5 is a vertical cross-sectional view of a second exemplary semiconductor structure according to a second embodiment of the present invention.

Referring to FIG. 5, a second exemplary semiconductor structure according to a second embodiment of the present invention comprises a semiconductor substrate 2, a first metal line level interconnect structure 6, a first back-end-of-line (BEOL) via level interconnect structure 8, and a second metal line level interconnect structure 9, which are the same as in the first embodiment. The second exemplary semiconductor structure further comprises a substrate contact via level interconnect structure 4, which contains a dielectric substrate-capping layer 60 and a MOL dielectric liner 62 having the same composition and structure as in the first embodiment.

After formation of the dielectric substrate-capping layer 60 and a MOL dielectric liner 62 and prior to deposition of an opaque conductive layer, a lower middle-of-line (MOL) dielectric layer 80A is formed directly on the top surface of the MOL dielectric liner 62.

In one case, the lower MOL dielectric layer 80A is formed by a conformal deposition or a non-conformal deposition. The lower MOL dielectric layer 80A may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. Alternately, the lower MOL dielectric layer 80A may comprise an organosilicate glass (OSG) or another low-k dielectric material having a dielectric constant value of less than 2.8. The MOL dielectric layer 80A is then planarized, for example, by chemical mechanical planarization (CMP).

In another case, the lower MOL dielectric layer 80A is formed by a self-planarizing process such as spin-on coating. The lower MOL dielectric layer 80A may comprise spin-on-glass (SOG) or a porous or non-porous low-k dielectric material having a dielectric constant less than 2.8.

Lithographic processes are employed to remove a portion of the lower MOL dielectric layer 80A in the area overlying semiconductor device to be subsequently covered with a conductive light shield. For example, a photoresist may be applied over the lower MOL dielectric layer 80A and lithographically patterned to block an area outside the conductive light shield to be subsequently formed. Employing the photoresist as an etch mask, an anisotropic etch may be performed to remove the lower MOL dielectric layer 80A over the area in which the conductive light shield is to be subsequently formed. Preferably, the anisotropic etch is selective to the MOL dielectric liner 62 or the dielectric substrate-capping layer 60.

Another photoresist is applied over the second exemplary semiconductor structure and lithographically patterned with holes overlying at least one node of the underlying semiconductor devices including the transfer transistor and other transistors. The holes in the pattern are formed within the area from which the lower MOL dielectric layer 80A is removed, i.e., within the area in which the conductive light shield is to be subsequently formed. The pattern in the photoresist is transferred into the MOL dielectric liner 62 and the dielectric substrate-capping layer 60 to form at least one via hole extending to a node of a semiconductor device on the semiconductor substrate 2. The nodes of the semiconductor devices on the semiconductor substrate 8 are selectively exposed, i.e., at least one node is exposed and at least another node is not exposed, so that only nodes to be electrically connected are exposed at the bottom of the at lease one via hole. For example, a via hole may be formed to expose a drain metal semiconductor alloy region 49 directly on the floating drain and another via hole may be formed to expose a gate metal semiconductor alloy region 59 directly on a gate electrode 52 of a source follower transistor of a unit image sensor pixel.

A opaque conductive layer (not shown) is deposited by methods known in the art, including chemical vapor deposition (CVD), physical vapor deposition (PVD), atomic layer deposition (ALD) etc. The opaque conductive layer may comprise a metallic material, and may comprise W, Ti, Ta, TiN, TaN, WN, or an alloy or a combination thereof. Alternately, the opaque conductive layer may comprise a doped semiconductor material such as doped polysilicon, a doped silicon germanium alloy, etc. The opaque conductive layer fills the volume from which the lower MOL dielectric layer 80A is removed beneath the top surface of the remaining portion of the lower MOL dielectric layer 80A. The opaque conductive layer also fills all of the at least one via holes in the MOL dielectric liner 62 and the dielectric substrate-capping layer 60. The opaque conductive layer is planarized, for example, by chemical mechanical planarization (CMP) to form a conductive light shield 78', which, for example, covers the floating drain 40 and other transistors except the area of a photosensitive diode (30, 32). The area covered by the conductive light shield 78' corresponds to the area of the light shield 280 in FIG. 2.

The conductive light shield 78' comprises at least one downward-protruding via portion abutting a semiconductor device and providing contact to the semiconductor device. The entirety of the conductive light shield 78' including the at least one downward-protruding via portion may have the same material composition. The entirety of the conductive light shield 78' including the at least one downward-protruding via portion may be of integral construction without any physically manifested interface therein. The at least one downward-protruding via portion is laterally surrounded by the MOL dielectric liner 62 and the dielectric substrate-capping layer 60.

The bottom surface of the conductive light shield 78' abuts the top surface of the MOL dielectric liner 62, which is non-planar. The contour of the bottom surface of the conductive light shield 78' follows the contour of the MOL dielectric liner 62, and is also non-planar. Particularly, the conductive light shield 78' may include at least two bottom surface portions separated from the semiconductor substrate 8 by different distances. The conductive light shield 78' has a top surface, which is coplanar with a top surface of the lower MOL dielectric layer 80A. The thickness of the conductive light shield 78', as measured at a thinnest portion of the conductive light shield 78', may be from about 10 nm to about 200 nm, and typically from about 40 nm to about 120 nm, although lesser and greater thicknesses are also contemplated herein.

The conductive light shield 78', due to its proximity to the top surface of the semiconductor substrate 2, blocks incident light over a large spherical angle as measured from the floating drain 40 and/or the various transistors in the sensing circuit, thereby suppressing photogeneration of charges in the floating drain 40 and the various transistors of the first exemplary semiconductor structure, which may be the transistors of a unit image sensor pixel. The conductive light shield 78' is a local wiring level that enables wiring only over the area covered by the conductive light shield 78'. The conductive light shield 78' is regionally confined, e.g., within the area of the unit image sensor pixel, and does not enable global interconnection across the region, e.g., outside the area of the unit image sensor pixel.

An upper middle-of-line (MOL) dielectric layer 80B is formed on the top surface of the conductive light shield 78' and the top surface of the lower MOL dielectric layer 80A. The upper MOL dielectric layer 80B may comprise a CVD oxide, an organosilicate glass (OSG), a spin-on-glass (SOG), a porous or non-porous spin-on material, or another low-k material having a dielectric constant value of less than 2.8 described above. The upper MOL dielectric layer 80 may comprise any material that may be employed for the lower MOL dielectric layer 80A.

The lower MOL dielectric layer 80A and the upper MOL dielectric layer 80B collectively constitute an MOL dielectric layer (80A, 80B). Preferably, the top surface of the upper MOL dielectric layer 80A is separated from the top surface of the conductive light shield 78' by a distance to prevent any dielectric breakdown through the upper MOL dielectric layer 80B. Preferably, the distance is greater than 20 nm, and more preferably greater than 100 nm. There may be a physically manifested interface between the lower MOL dielectric layer 80A and the upper MOL dielectric layer 80B. The lower MOL dielectric layer 80A directly adjoins a bottom surface of the conductive light shield 78' at the bottom of the sidewalls of the conductive light shield 78'.

In one embodiment, the lower MOL dielectric layer 80A and the upper MOL dielectric layer 80B comprise a same dielectric material. In another embodiment, the lower MOL dielectric layer 80A and the upper MOL dielectric layer 80B comprise different dielectric materials.

A photoresist (not shown) is applied over the upper MOL dielectric layer 80B and is lithographically patterned to form at least one hole. The pattern in the photoresist is transferred through the upper MOL dielectric layer 80B, the lower MOL dielectric layer 80A, the MOL dielectric liner 62, and the dielectric substrate-capping layer 60 to expose a node of a semiconductor device on the semiconductor substrate 8. The photoresist is removed selective to the upper MOL dielectric layer 80B. A metal is deposited on the exposed surfaces of the upper MOL dielectric layer 80B and exposed surfaces within the at least one hole including the exposed surface of the semiconductor device. The portion of the deposited metal above the top surface of the upper MOL dielectric layer 80B is removed by planarization, recess etch, or a combination thereof. The remaining portions of the deposited metal in the at least one hole constitutes at least one contact via 88, which extends from a top surface of the upper MOL dielectric layer 80B through the MOL dielectric layer (80A, 80B), the MOL dielectric liner 62, and the dielectric substrate-capping layer 60 onto a top surface of a semiconductor device on the semiconductor substrate 8. For example, the at least one contact via 88 may contact a top surface of one of source and drain metal semiconductor alloy regions 49.

Each of the at least one contact via 88 may be formed by a single deposition step without exposure to air. Thus, each of the at least one contact via 88 is of integral construction without any physically manifested interface therein. Each of the at least one contact via 88 has a top surface that is coplanar with a top surface of the MOL dielectric layer (80A, 80B) and a bottom surface that is coplanar with a bottom surface of the dielectric substrate-capping layer 60. The at least one contact via 88 comprises a metallic material such as W, Ta, Ti, WN, TaN, and TiN.

A first metal line level interconnect structure 6, a first back-end-of-line (BEOL) via level interconnect structure 8, and a second metal line level interconnect structure 9 may be formed as in the first embodiment. Additional via level interconnect structures (not shown) and additional metal line level interconnect structures may be formed as needed.

Figure 6:
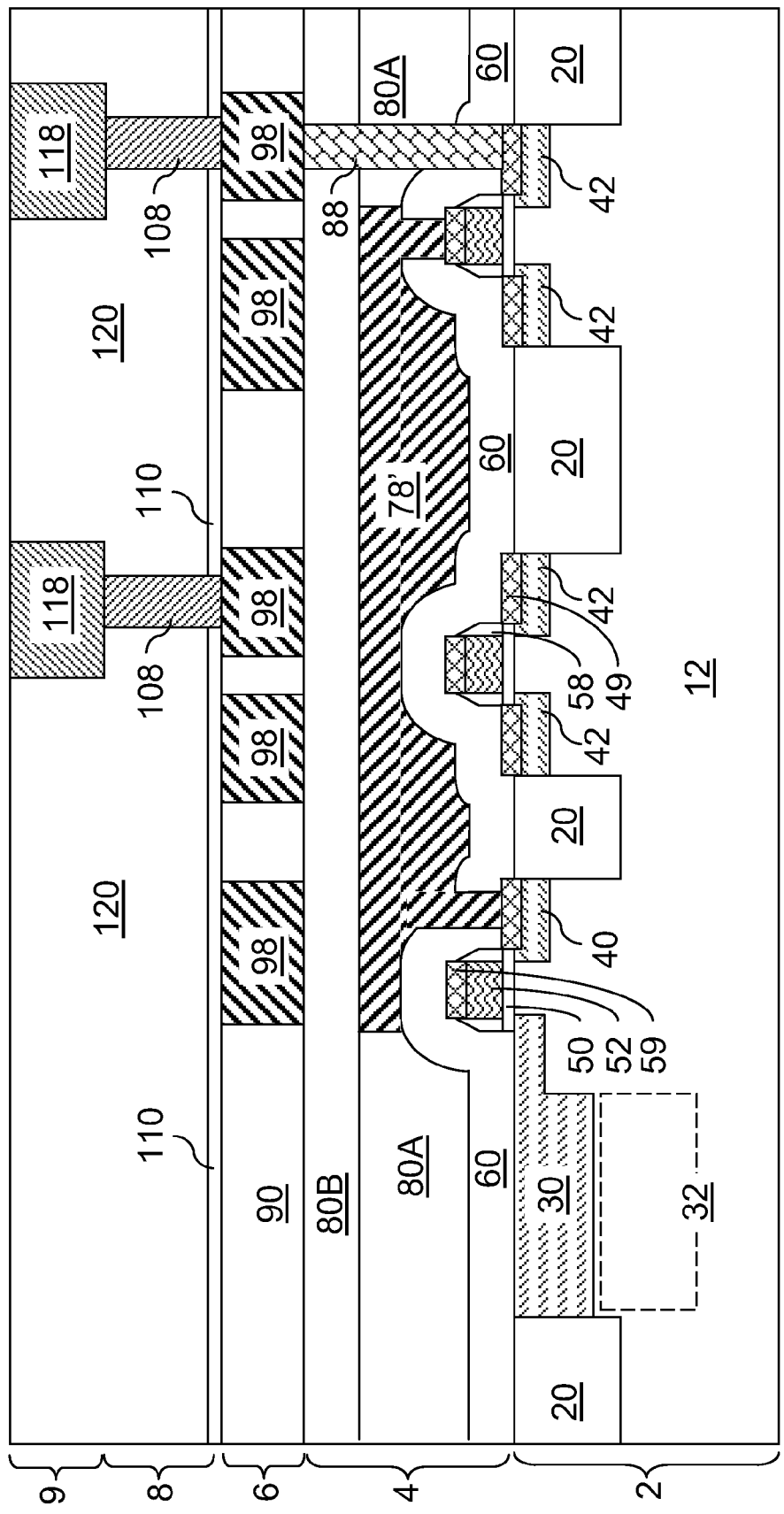
FIG. 6 is a vertical cross-sectional view of a variation on the second exemplary semiconductor structure according to the second embodiment of the present invention.

Referring to FIG. 6, a variation of the second exemplary semiconductor structure is shown, in which a conductive light shield 78' is formed directly on a dielectric substrate-capping layer 60. The lower MOL dielectric layer 80A is formed directly on the top surface of the dielectric substrate-capping layer 60. In other words, a MOL dielectric liner 62 of the second exemplary semiconductor structure of FIG. 5 is omitted in this variation of the second exemplary semiconductor structure. The upper MOL dielectric layer 80B is formed directly on the top surface of the conductive light shield 78'.

The MOL dielectric layer (80A, 80B) is located over the dielectric substrate-capping layer 60 and underneath the first metal lines 98. The conductive light shield 78' comprises at least one downward-protruding via portion abutting a semiconductor device. The at least one downward-protruding via portion of the conductive light shield 78' is laterally surrounded by the dielectric substrate-capping layer 60. The bottom surface of the conductive light shield 78' is non-planar and abuts the top surface of the dielectric substrate-capping layer 60.

Figure 7:
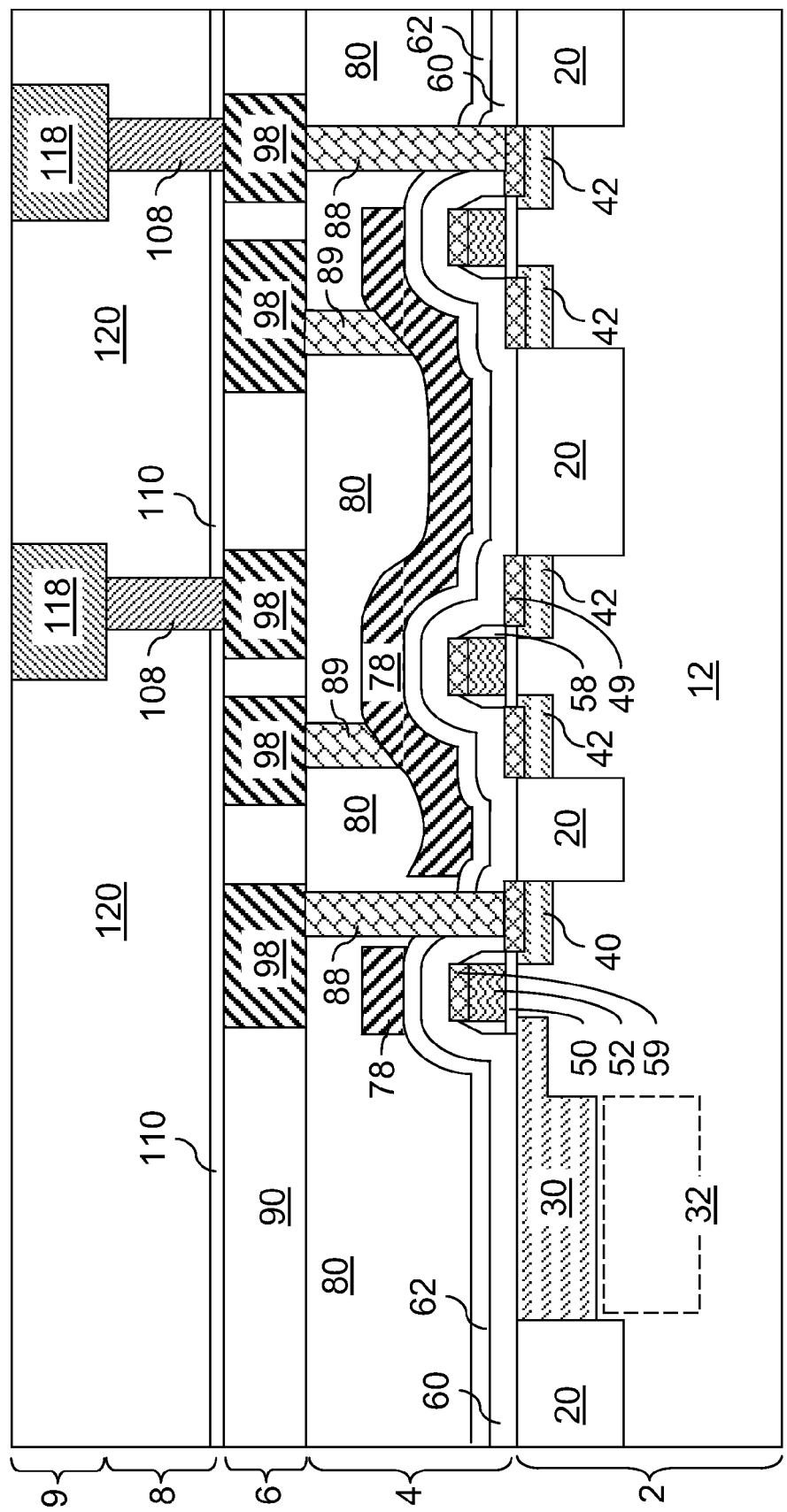
FIG. 7 is a vertical cross-sectional view of a third exemplary semiconductor structure according to a third embodiment of the present invention.

Referring to FIG. 7, a third exemplary semiconductor structure according to a third embodiment of the present invention comprises a semiconductor substrate 2, a first metal line level interconnect structure 6, a first back-end-of-line (BEOL) via level interconnect structure 8, and a second metal line level interconnect structure 9, which are the same as in the first embodiment. The second exemplary semiconductor structure further comprises a substrate contact via level interconnect structure 4, which contains a dielectric substrate-capping layer 60 and a MOL dielectric liner 62 having the same composition and structure as in the first embodiment.

After formation of the dielectric substrate-capping layer 60 and a MOL dielectric liner 62, an opaque conductive layer is formed directly on the top surface of the MOL dielectric liner 62. Prior to formation of the opaque conductive layer, at least one hole may, or may not, be formed in the stack of the dielectric substrate-capping layer 60 and the MOL dielectric liner 62. The opaque conductive layer is subsequently patterned to form a conductive light shield 78 in the same manner as in the first embodiment. The conductive light shield 78 of the third embodiment may, or may not, include at least one downward-protruding via portion abutting a semiconductor device and providing contact to the semiconductor device.

After formation of a middle-of-line (MOL) dielectric layer 80 in the same manner as in the first embodiment, two types of via holes are formed in the MOL dielectric layer 80. At least one first-type via hole extends from a top surface of the MOL dielectric layer 80 through the MOL dielectric layer 80, the MOL dielectric liner 62, and the dielectric substrate-capping layer 60 to a node of a semiconductor device on the semiconductor substrate 2. Each of the at least one first-type via hole is formed outside the area of the conductive light shield 78. At least one second-type via hole extends from the top surface of the MOL dielectric layer 80 through the MOL dielectric layer 80 to a top surface of the conductive light shield 78. Each of the at least one second-type via hole is formed within the area of the conductive light shield 78.

A metal is deposited on the exposed surfaces of the MOL dielectric layer 80 and exposed surfaces within the at least one first-type hole and the at least one second-type hole. The portion of the deposited metal above the top surface of the MOL dielectric layer 80 is removed by planarization, recess etch, or a combination thereof. The remaining portions of the deposited metal in the at least one first-type hole constitutes at least one contact via 88, which extends from a top surface of the MOL dielectric layer 80 through the MOL dielectric layer 80, the MOL dielectric liner 62, and the dielectric substrate-capping layer 60 onto a top surface of a semiconductor device on the semiconductor substrate 8. For example, the at least one contact via 88 may contact a top surface of one of source and drain metal semiconductor alloy regions 49. The remaining portions of the deposited metal in the at least one second-type hole constitutes at least one metal-light-shield-contacting via 89, which extends from the top surface of the MOL dielectric layer 80 through the MOL dielectric layer 80 onto the top surface of the conductive light shield 78.

Each of the at least one contact via 88 and the at least one metal-light-shield-contacting via 89 may be formed by a single deposition step without exposure to air. Thus, each of the at least one contact via 88 and the at least one metal-light-shield-contacting via 89 is of integral construction without any physically manifested interface therein. Each of the at least one contact via 88 and the at least one metal-light-shield-contacting via 89 has a top surface that is coplanar with a top surface of the MOL dielectric layer (80A, 80B). Each of the at least one contact via 88 has a bottom surface that is coplanar with a bottom surface of the dielectric substrate-capping layer 60. Each of the at least one metal-light-shield-contacting via 89 has a bottom surface that is coplanar with a top surface of the conductive light shield 78. The at least one contact via 88 comprises a metallic material such as W, Ta, Ti, WN, TaN, and TiN.

The conductive light shield 78, due to its proximity to the top surface of the semiconductor substrate 2, blocks incident light over a large spherical angle as measured from the floating drain 40 and/or the various transistors in the sensing circuit, thereby suppressing photogeneration of charges in the floating drain 40 and the various transistors of the first exemplary semiconductor structure, which may be the transistors of a unit image sensor pixel. The conductive light shield 78 is a local wiring level that enables wiring only over the area covered by the conductive light shield 78 in conjunction with first metal lines to be subsequently formed. The conductive light shield 78 is regionally confined, e.g., within the area of the unit image sensor pixel, and does not enable global interconnection across the region, e.g., outside the area of the unit image sensor pixel.

A first metal line level interconnect structure 6, a first back-end-of-line (BEOL) via level interconnect structure 8, and a second metal line level interconnect structure 9 may be formed as in the first embodiment. Additional via level interconnect structures (not shown) and additional metal line level interconnect structures may be formed as needed.

Figure 8:
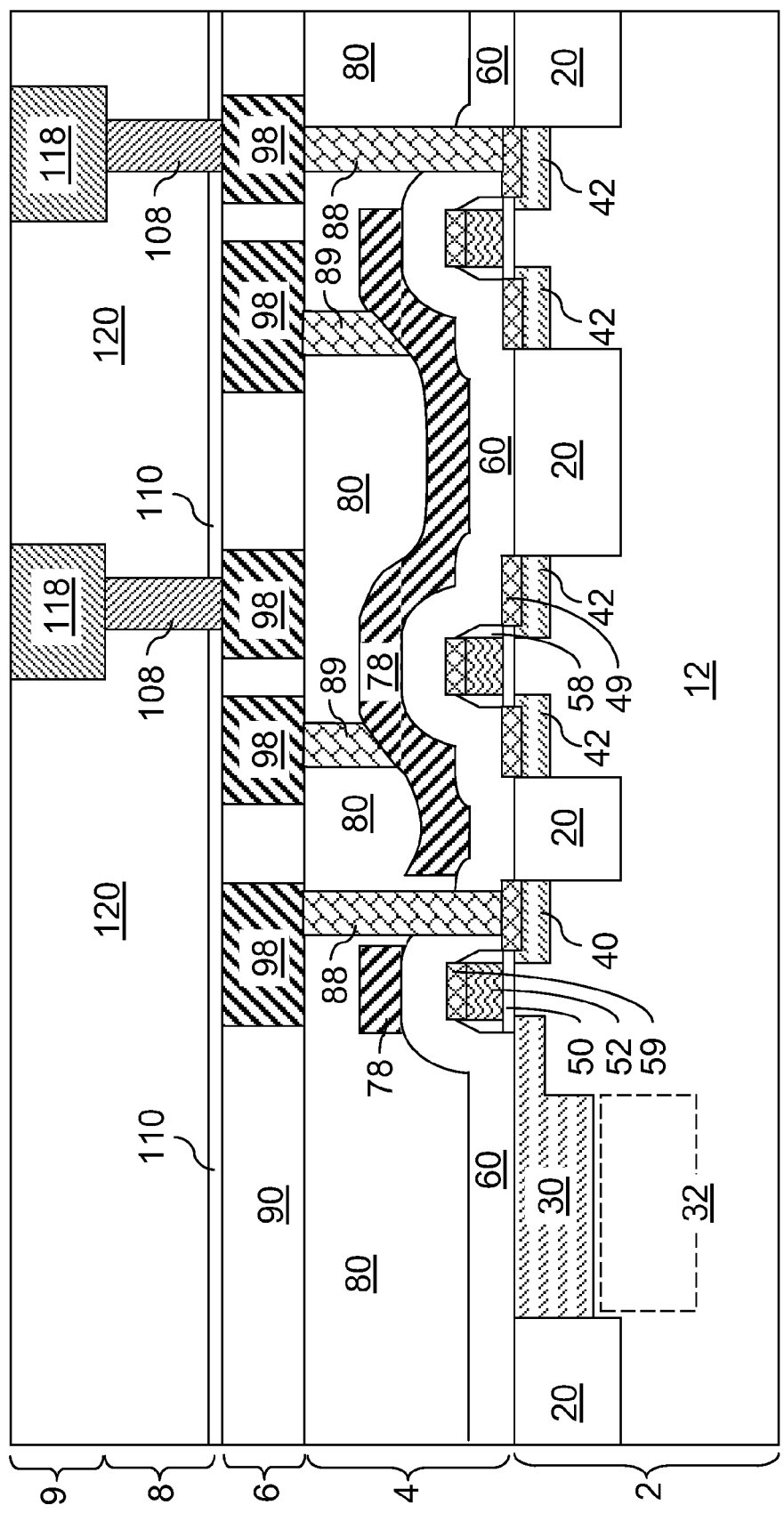
FIG. 8 is a vertical cross-sectional view of a variation on the third exemplary semiconductor structure according to the third embodiment of the present invention.

Referring to FIG. 8, a variation of the third exemplary semiconductor structure is shown, in which a conductive light shield 78 is formed directly on a dielectric substrate-capping layer 60. The MOL dielectric layer 80 is formed directly on the top surface of the dielectric substrate-capping layer 60 and the top surface of the conductive light shield 78. In other words, a MOL dielectric liner 62 of the third exemplary semiconductor structure of FIG. 7 is omitted in this variation of the third exemplary semiconductor structure.

The MOL dielectric layer 80 is located over the dielectric substrate-capping layer 60 and underneath the first metal lines 98. The conductive light shield 78 comprises at least one downward-protruding via portion abutting a semiconductor device. The at least one downward-protruding via portion (not shown) of the conductive light shield 78, if present, is laterally surrounded by the dielectric substrate-capping layer 60. The bottom surface of the conductive light shield 78 is non-planar and abuts the top surface of the dielectric substrate-capping layer 60.

Figure 9:
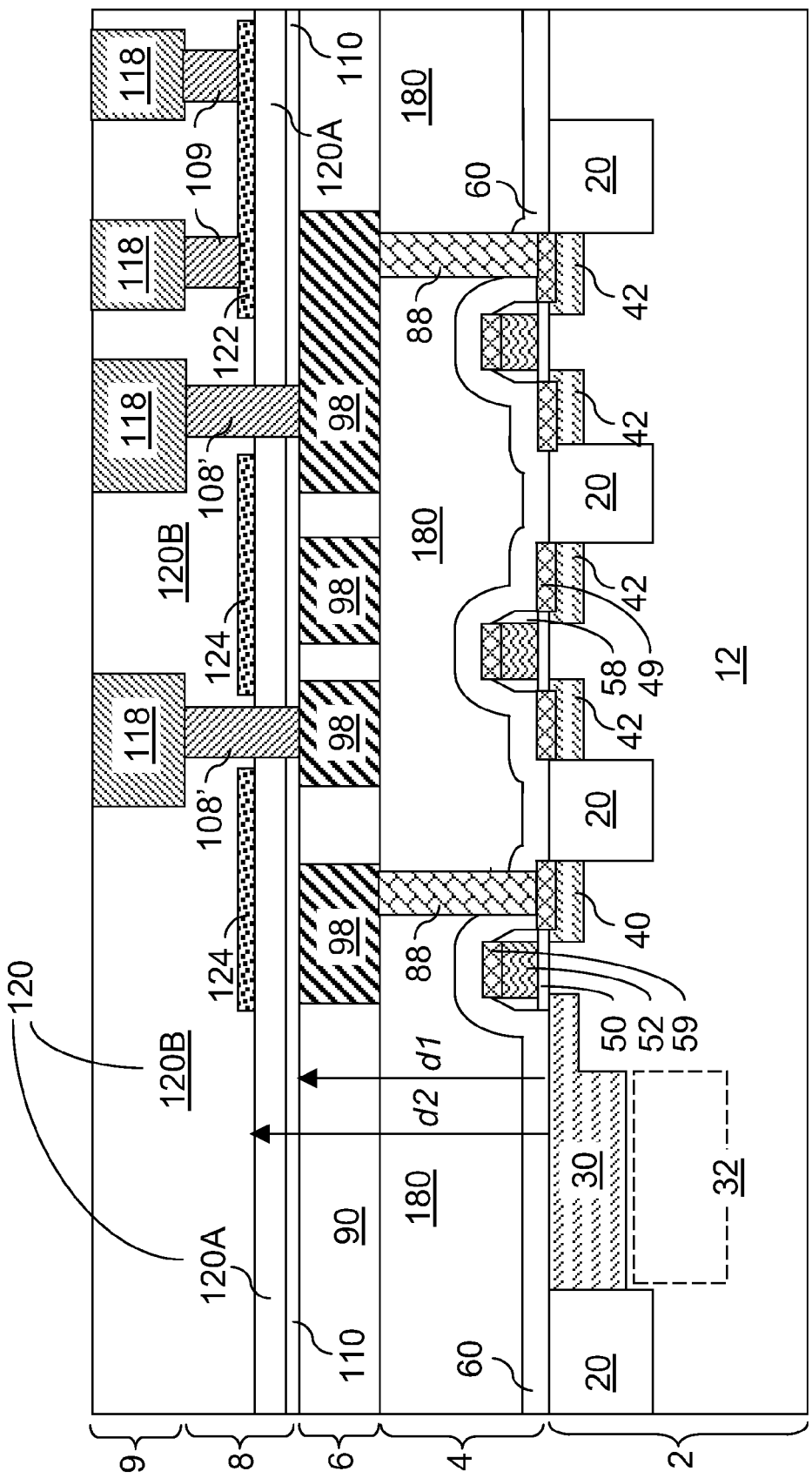
FIG. 9 is a vertical cross-sectional view of a fourth exemplary semiconductor structure according to a fourth embodiment of the present invention.

Referring to FIG. 9, a fourth exemplary semiconductor structure according to a fourth embodiment of the present invention comprises a semiconductor substrate 2, a first metal line level interconnect structure 6, and a second metal line level interconnect structure 9, which are the same as in the first embodiment. No conductive light shield is formed in the substrate contact via level interconnect structure 4 in the fourth exemplary semiconductor structure. Instead, a conductive light shield 124 is formed in a first back-end-of-line (BEOL) via level interconnect structure 8 in the fourth embodiment of the present invention.

The processing steps employed to form the fourth exemplary semiconductor structure are the same as the processing steps of the first exemplary semiconductor structure except that the processing steps employed to form a conductive light shield in the substrate contact via level interconnect structure 4 are omitted. The MOL dielectric liner 62 is optional, i.e., may also be omitted in the fourth exemplary semiconductor structure. In one case, the MOL dielectric liner 62 is formed on the entirety of the dielectric substrate-capping layer 60.

After formation of the first metal line level interconnect structure 6, a back-end-of-line dielectric capping layer 110 and a lower second level dielectric layer 120A are formed over the first metal line level interconnect structure 6 by methods known in the art including chemical vapor deposition and spin-on deposition. The lower second level dielectric layer 120A may comprise any material that may be employed for the second level dielectric layer 120 of the first embodiment. A metal layer is formed on the lower second level dielectric layer 120A and lithographically patterned to form a conductive light shield 124 and a metal resistor 122.

The conductive light shield 124 covers an area of the fourth semiconductor structure from which exclusion of incident light is desired. The conductive light shield 124 may cover, for example, the floating drain 40 and other transistors except the area of a photosensitive diode (30, 32) in a unit image sensor pixel. The area covered by the conductive light shield 124 corresponds to the area of the light shield 280 in FIG. 2. The conductive light shield 124 blocks incident light over a spherical angle as measured from the floating drain 40 and/or the various transistors in the sensing circuit, thereby suppressing photogeneration of charges in the floating drain 40 and the various transistors of the fourth exemplary semiconductor structure, which may be the transistors of a unit image sensor pixel.

The conductive light shield 124 and the metal resistor 122 have the same composition and the same thickness. The conductive light shield 124 and the metal resistor 122 may comprise a conductive metal or a conductive metal nitride having a suitable level of resistivity. For example, the conductive light shield 124 and the metal resistor 122 may comprise TaN, TiN, WN, Ta, Ti, W, an alloy thereof, or a combination thereof. The thickness of the conductive light shield 124 and the metal resistor 122 may be from about 1 nm to about 100 nm, and typically from about 5 nm to about 30 nm, although lesser and greater thicknesses are also contemplated herein.

The conductive light shield 124 and the metal resistor 122 are separated from the top surface of the semiconductor substrate 2 farther away than the top surface of the first metal lines 98. For example, the distance between the top surfaces of the first metal lines 98 and the top surface of the semiconductor substrate 2, which is herein referred to as a first distance d1, is less than the distance between the top surface of the lower second level dielectric layer 120A and the top surface of the semiconductor substrate 2, which is herein referred to as a second distance d2. The bottom surface of the conductive light shield 124 and the bottom surface of the metal resistor 122 abut the top surface of the lower second level dielectric layer 120A.

An upper second level dielectric layer 120B is formed over the conductive light shield 124 and the bottom surface of the metal resistor 122. The upper second level dielectric layer 120B may comprise any material that may be employed for the lower second level dielectric layer 120A. The lower second level dielectric layer 120A and the upper second level dielectric layer 120B collectively constitute a second level dielectric layer 120. Two types of second level via holes are formed in the second level dielectric layer 120. At least one first-type second level via hole extends through the upper second level dielectric layer 120B, the lower second level dielectric layer 120A, and the back-end-of-line dielectric capping layer 110 onto a top surface of the first metal lines 98. Each of the at least one first-type second level via hole is formed outside the area of the conductive light shield 124. At least one second-type second level via hole extends to the metal resistor 122. Each of the at least one second-type second level via hole is formed within the area of the metal resistor 122.

Line troughs are formed in the upper portion of the upper second level dielectric layer 120B by methods known in the art. Metal fills the first-type and second-type second level via holes and second level line troughs by deposition such as a combination of physical vapor deposition and plating. The deposited metal is planarized by chemical mechanical planarization (CMP), recess etch, or a combination thereof to form first-type second level vias 108' in the first-type second level via holes, second-type second level vias 109 in the second-type second level via holes, and second metal lines 118 in the line troughs. The first-type second level vias 108', the second-type second level vias 109, and the second metal lines 118 may comprise, for example, Cu or Al.

Two dielectric layers encapsulate the conductive light shield 124 of the fourth embodiment. Specifically, the entirety of the surfaces of the conductive light shield 124 abut the lower second level dielectric layer 120A and the upper second level dielectric layer 120B, and the conductive light shield 124 is encapsulated by the second level dielectric layer (120A, 120B).

The back-end-of-line dielectric capping layer 110, the lower second level dielectric layer 120A, the lower portion of the upper second level dielectric layer 120B, the conductive light shield 124, the metal resistor 122, the first-type second level vias 108', and the second-type second level vias 109 collectively constitute the first back-end-of-line (BEOL) via level interconnect structure 8. The upper portion of the upper second level dielectric layer 120B and the second metal lines 118 collectively constitute the second metal line level interconnect structure 9. Additional via level interconnect structures (not shown) and additional metal line level interconnect structures may be formed as needed.

While the present invention is described with a conductive light shield 124 formed between first metal lines 98 formed in the first metal line level interconnect structure 6 and second metal lines 118 formed in the second metal line level interconnect structure 9, one skilled in the art may form another conductive light shield having the same structure between any first-level metal line separated from a top surface of the semiconductor substrate 2 and any second level metal line located one level above the first-level metal line. Such variations are explicitly contemplated herein.

Figure 10:
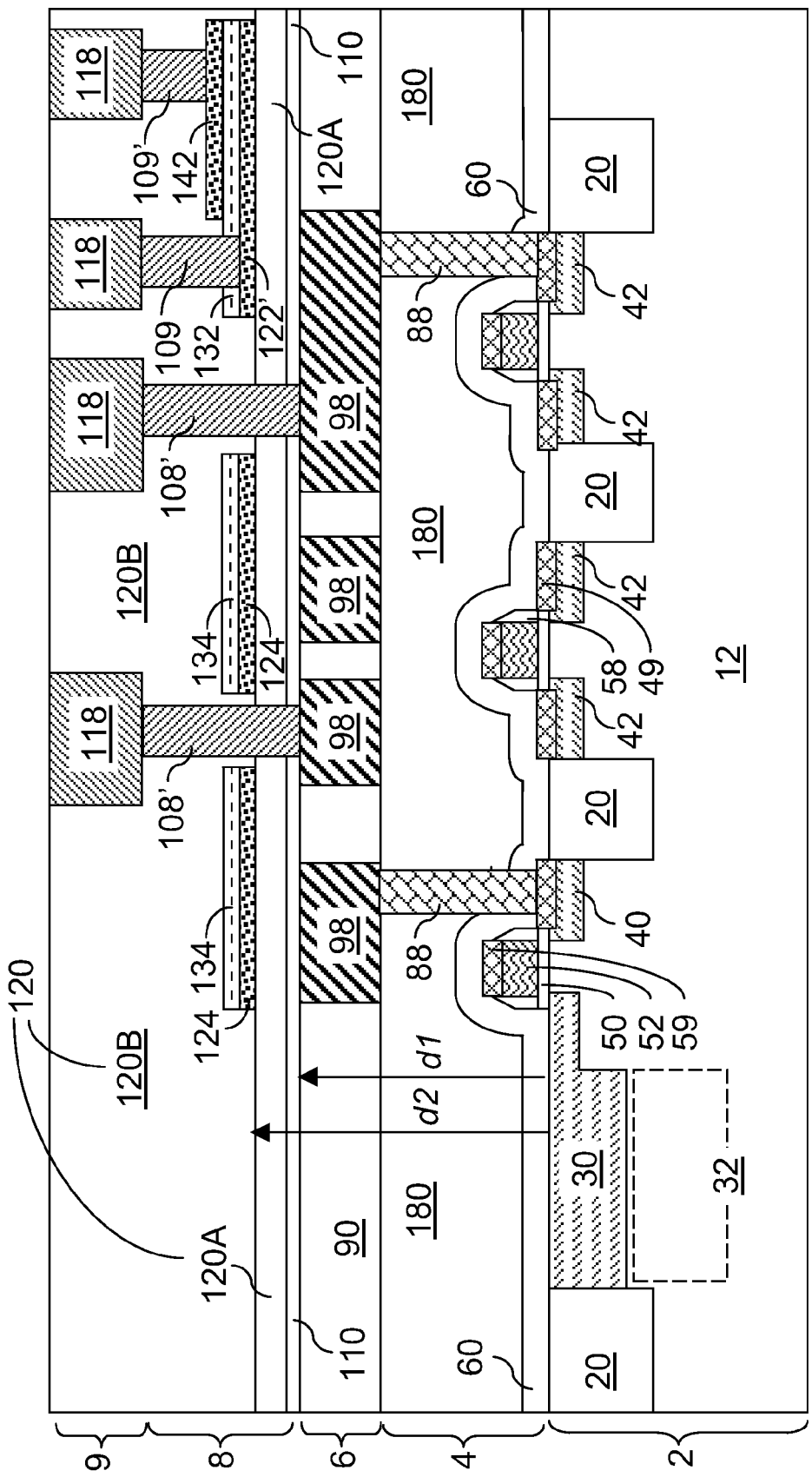
FIG. 10 is a vertical cross-sectional view of a fifth exemplary semiconductor structure according to a fifth embodiment of the present invention.

Referring to FIG. 10, a fifth exemplary semiconductor structure according to a fifth embodiment of the present invention comprises a semiconductor substrate 2, a substrate contact via level interconnect structure 4, a first metal line level interconnect structure 6, and a second metal line level interconnect structure 9, which are the same as in the fourth embodiment. The structures in a first back-end-of-line (BEOL) via level interconnect structure 8 are different compared with the fourth embodiment.

After formation of the first metal line level interconnect structure 6, a back-end-of-line dielectric capping layer 110 and a lower second level dielectric layer 120A are formed over the first metal line level interconnect structure 6 as in the fourth embodiment. A stack of a metal layer (not shown) and a node dielectric layer (not shown) is formed on the lower second level dielectric layer 120A and lithographically patterned to form a first stack of a conductive light shield 124 and a dielectric portion 134 and a second stack of a lower capacitor electrode 122' and a node dielectric 132.

The first stack of the conductive light shield 124 and the dielectric portion 134 covers an area of the fifth semiconductor structure from which exclusion of incident light is desired. The first stack of the conductive light shield 124 and the dielectric portion 134 may cover, for example, the floating drain 40 and other transistors except the area of a photosensitive diode (30, 32) in a unit image sensor pixel. The area covered by first stack of the conductive light shield 124 and the dielectric portion 134 corresponds to the area of the light shield 280 in FIG. 2. The first stack of the conductive light shield 124 and the dielectric portion 134 blocks incident light over a spherical angle as measured from the floating drain 40 and/or the various transistors in the sensing circuit, thereby suppressing photogeneration of charges in the floating drain 40 and the various transistors of the fifth exemplary semiconductor structure, which may be the transistors of a unit image sensor pixel.

The conductive light shield 124 and the lower capacitor electrode 122' have the same composition and the same thickness. The conductive light shield 124 and the lower capacitor electrode 122' may comprise a conductive metal or a conductive metal nitride having a suitable level of resistivity. For example, the conductive light shield 124 and the lower capacitor electrode 122' may comprise TaN, TiN, WN, Ta, Ti, W, an alloy thereof, or a combination thereof. The thickness of the conductive light shield 124 and the lower capacitor electrode 122' may be from about 1 nm to about 100 nm, and typically from about 5 nm to about 30 nm, although lesser and greater thicknesses are also contemplated herein.

The conductive light shield 124 and the lower capacitor electrode 122' are separated from the top surface of the semiconductor substrate 2 farther away than the top surface of the first metal lines 98. For example, the distance between the top surfaces of the first metal lines 98 and the top surface of the semiconductor substrate 2, which is herein referred to as a first distance d1, is less than the distance between the top surface of the lower second level dielectric layer 120A and the top surface of the semiconductor substrate 2, which is herein referred to as a second distance d2. The bottom surface of the conductive light shield 124 and the bottom surface of the lower capacitor electrode 122' abut the top surface of the lower second level dielectric layer 120A.

The dielectric portion 134 and the node dielectric 132 have the same composition and the same thickness. The dielectric portion 134 and the node dielectric 132 comprise a dielectric material such as silicon nitride. The thickness of the dielectric portion 134 and the node dielectric 132 may be from about 5 nm to about 30 nm, although lesser and greater thicknesses are also contemplated herein.

Another metal layer (not shown) is formed over the node dielectric 132 and lithographically patterned to form an upper capacitor electrode 142. The upper capacitor electrode 142 may comprise TaN, TiN, WN, Ta, Ti, W, an alloy thereof, or a combination thereof. The thickness of the upper capacitor electrode 142 may be from about 1 nm to about 100 nm, and typically from about 5 nm to about 30 nm, although lesser and greater thicknesses are also contemplated herein.

An upper second level dielectric layer 120B is formed over the dielectric portion 134, a portion of the node dielectric 132, and the upper capacitor electrode 142. The upper second level dielectric layer 120B may comprise any material that may be employed for the lower second level dielectric layer 120A. The lower second level dielectric layer 120A and the upper second level dielectric layer 120B collectively constitute a second level dielectric layer 120. Three types of second level via holes are formed in the second level dielectric layer 120. At least one first-type second level via hole extends through the upper second level dielectric layer 120B, the lower second level dielectric layer 120A, and the back-end-of-line dielectric capping layer 110 onto a top surface of the first metal lines 98. Each of the at least one first-type second level via hole is formed outside the area of the conductive light shield 124. At least one second-type second level via hole extends through a portion of the upper second level dielectric layer 120B to the lower capacitor electrode 122'. Each of the at least one second-type second level via hole is formed within the area of the lower capacitor electrode 122' and outside the area of the upper capacitor electrode 142. At least one third-type second level via hole extends to the upper capacitor electrode 142. Each of the at least one third-type second level via hole is formed within the area of the upper capacitor electrode 142.

Line troughs are formed in the upper portion of the upper second level dielectric layer 120B by methods known in the art. Metal fills the first-type, second-type, and third-type second level via holes and second level line troughs by deposition such as a combination of physical vapor deposition and plating. The deposited metal is planarized by chemical mechanical planarization (CMP), recess etch, or a combination thereof to form first-type second level vias 108' in the first-type second level via holes, second-type second level vias 109 in the second-type second level via holes, third-type second level vias 109' in the third-type second level via holes, and second metal lines 118 in the line troughs. The first-type second level vias 108', the second-type second level vias 109, the third-type second level vias 109', and the second metal lines 118 may comprise, for example, Cu or Al.

Two dielectric layers encapsulate the conductive light shield 124 of the fifth embodiment. Specifically, the entirety of the stack of the conductive light shield 124 and the dielectric portion 134 abut the lower second level dielectric layer 120A and the upper second level dielectric layer 120B, and stack of the conductive light shield 124 and the dielectric portion 134 is encapsulated by the second level dielectric layer (120A, 120B). Thus, the conductive light shield 124 is encapsulated by the second level dielectric layer (120A, 120B).

The lower capacitor electrode 122', the node dielectric 132, and the upper capacitor electrode 142 collectively constitute a metal-insulator-metal capacitor (MIMCAP). The back-end-of-line dielectric capping layer 110, the lower second level dielectric layer 120A, the lower portion of the upper second level dielectric layer 120B, the conductive light shield 124, the dielectric portion 134, the MIMCAP (122', 132, 142), the first-type second level vias 108', the second-type second level vias 109, and the third-type second level vias 109' collectively constitute the first back-end-of-line (BEOL) via level interconnect structure 8. The upper portion of the upper second level dielectric layer 120B and the second metal lines 118 collectively constitute the second metal line level interconnect structure 9. Additional via level interconnect structures (not shown) and additional metal line level interconnect structures may be formed as needed.

Figure 11:
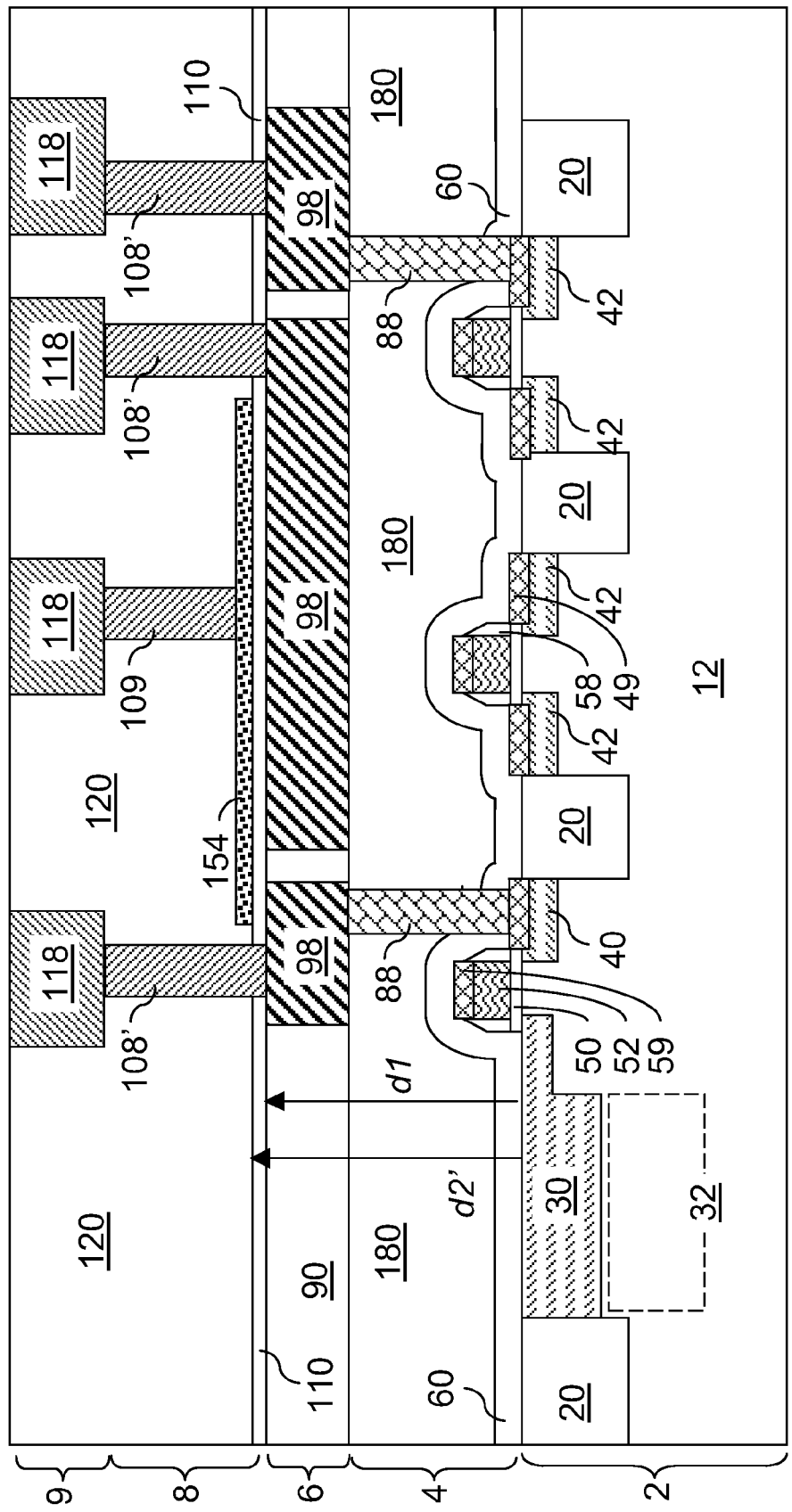
FIG. 11 is a vertical cross-sectional view of a sixth exemplary semiconductor structure according to a sixth embodiment of the present invention.

Referring to FIG. 11, a sixth exemplary semiconductor structure according to a sixth embodiment of the present invention comprises a semiconductor substrate 2, a substrate contact via level interconnect structure 4, and a second metal line level interconnect structure 9, which are the same as in the fourth and fifth embodiments. A first metal line level interconnect structure 6 is altered so that at least one of the first metal lines 98 covers a substantial portion of an area from which blockage of incident light is desired. The structures in a first back-end-of-line (BEOL) via level interconnect structure 8 are different compared with the fourth and fifth embodiments.

After formation of the first metal line level interconnect structure 6, a back-end-of-line dielectric capping layer 110 is formed over the first metal line level interconnect structure 6 as in the fourth and fifth embodiments. A metal layer (not shown) is formed directly on the back-end-of-line dielectric capping layer 110 and lithographically patterned to form a conductive light shield 154, which covers an area of the sixth semiconductor structure from which exclusion of incident light is desired. The combination of the conductive light shield 154 and first metal lines 98 may cover, for example, the floating drain 40 and other transistors except the area of a photosensitive diode (30, 32) in a unit image sensor pixel. The area covered by combination of the conductive light shield 154 and first metal lines 98 corresponds to the area of the light shield 280 in FIG. 2. The combination of the conductive light shield 154 and first metal lines 98 blocks incident light over a spherical angle as measured from the floating drain 40 and/or the various transistors in the sensing circuit, thereby suppressing photogeneration of charges in the floating drain 40 and the various transistors of the fifth exemplary semiconductor structure, which may be the transistors of a unit image sensor pixel.

The conductive light shield 154 may comprise TaN, TiN, WN, Ta, Ti, W, an alloy thereof, or a combination thereof. The thickness of the conductive light shield 154 may be from about 1 nm to about 100 nm, and typically from about 5 nm to about 30 nm, although lesser and greater thicknesses are also contemplated herein.

The conductive light shield 154 is separated from the top surface of the semiconductor substrate 2 farther away than the top surface of the first metal lines 98. For example, the distance between the top surfaces of the first metal lines 98 and the top surface of the semiconductor substrate 2, which is herein referred to as a first distance d1, is less than the distance between the top surface of the back-end-of-line dielectric capping layer 110 and the top surface of the semiconductor substrate 2, which is herein referred to as a second distance d2'. The bottom surface of the conductive light shield 154 abuts the top surface of the back-end-of-line dielectric capping layer 110.

A second level dielectric layer 120 is formed over the conductive light shield 154 and the top surface of the back-end-of-line dielectric capping layer 110. The second level dielectric layer 120 may comprise the same material and have the same thickness as in the first through third embodiments. Two types of second level via holes are formed in the second level dielectric layer 120. At least one first-type second level via hole extends through the second level dielectric layer 120 and the back-end-of-line dielectric capping layer 110 onto a top surface of the first metal lines 98. Each of the at least one first-type second level via hole is formed outside the area of the conductive light shield 154. At least one second-type second level via hole extends through a portion of the second level dielectric layer 120B to a top surface of the conductive light shield 154. Each of the at least one second-type second level via hole is formed within the area of the conductive light shield 154.

Line troughs are formed in the upper portion of the upper portion of the second level dielectric layer 120 by methods known in the art. Metal fills the first-type and second-type second level via holes and the second level line troughs by deposition such as a combination of physical vapor deposition and plating. The deposited metal is planarized by chemical mechanical planarization (CMP), recess etch, or a combination thereof to form first-type second level vias 108' in the first-type second level via holes, second-type second level vias 109 in the second-type second level via holes, and second metal lines 118 in the line troughs. The first-type second level vias 108', the second-type second level vias 109, and the second metal lines 118 may comprise, for example, Cu or Al.

One of the first metal lines 98, the back-end-of-line dielectric capping layer 110, and the upper capacitor electrode 142 collectively constitute a metal-insulator-metal capacitor (MIMCAP). The back-end-of-line dielectric capping layer 110, a lower portion of the second level dielectric layer 120, the conductive light shield 154, the first-type second level vias 108', and the second-type second level vias 109 collectively constitute the first back-end-of-line (BEOL) via level interconnect structure 8. The upper portion of the second level dielectric layer 120 and the second metal lines 118 collectively constitute the second metal line level interconnect structure 9. Additional via level interconnect structures (not shown) and additional metal line level interconnect structures may be formed as needed.

Figure 12:
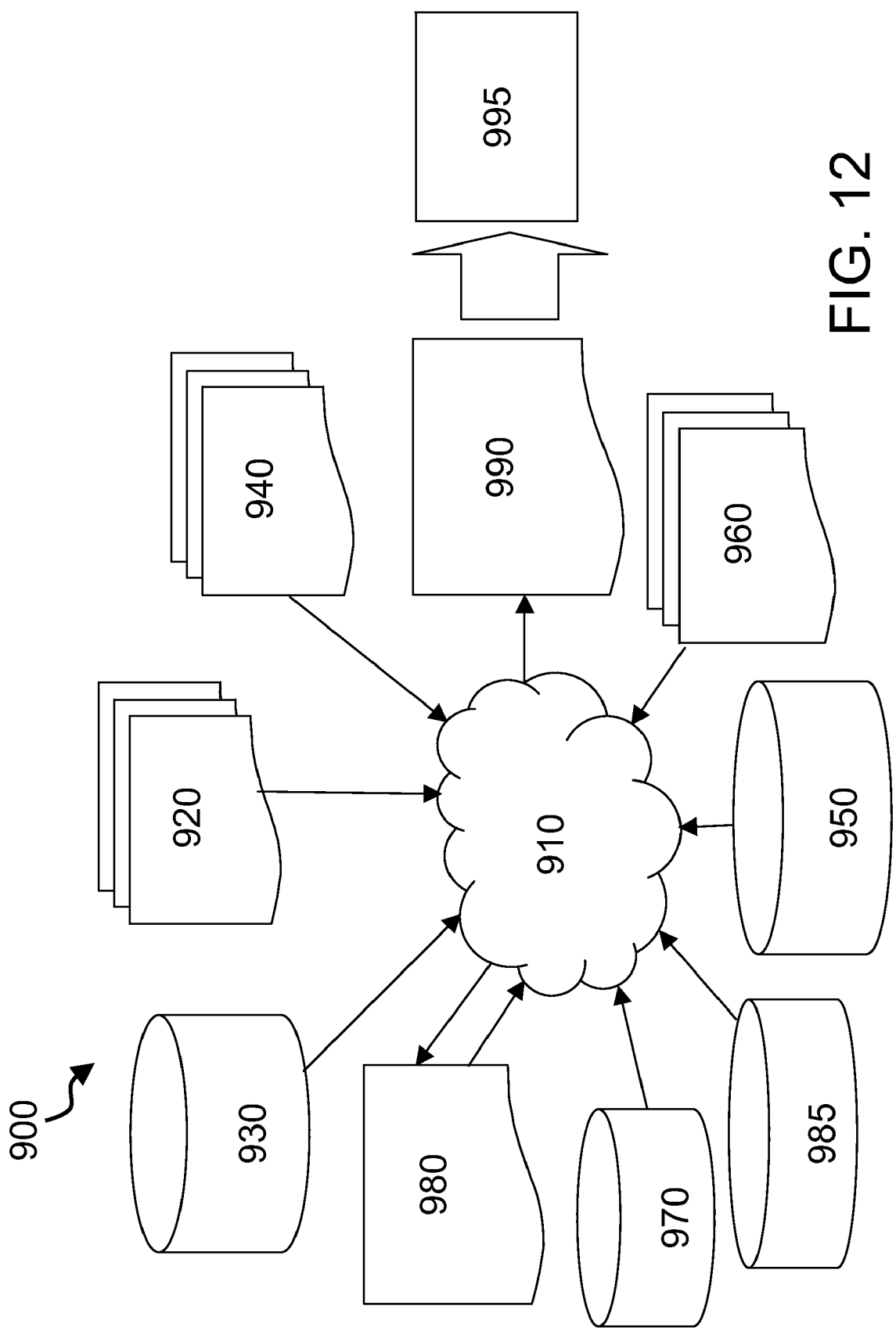
FIG. 12 is a flow diagram of a design process used in semiconductor design and manufacture of the semiconductor circuits according to the present invention.

FIG. 12 shows a block diagram of an exemplary design flow 900 used for example, in semiconductor design and manufacturing of the semiconductor circuit according to the present invention. Design flow 900 may vary depending on the type of integrated circuit (IC) being designed. For example, a design flow for building an application specific integrated circuit (ASIC) may differ from a design flow for designing a standard integrated circuit component. Design structure 920 is preferably an input to a design process 910 and may come from an intellectual property (IP) provider, a core developer, or a design company, or may be generated by the operator of a design flow, or may come from other sources.

Design structure 920 comprises an embodiment of present invention as shown in any of FIGS. 2-11 in the form of schematics or hardware description language (HDL; e.g. Verilog, VHDL, C, etc.) The design structure 920 may be contained on one or more machine readable medium. For example, design structure 920 may be a text file or a graphical representation of an embodiment of the invention as shown in FIGS. 2-11.

Design process 910 preferably synthesizes (or translates) an embodiment of the invention as show in FIGS. 2-11 into a netlist 980, where netlist 980 is, for example, a list of conductive light shields, wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 980 is resynthesized one or more times depending on design specifications and parameters for the circuit.

The design process 910 may include using a variety of inputs; for example, inputs from library elements 930 which may house a set of commonly used elements, circuits, and devices, including models, layouts, and symbolic representations, for a given manufacturing technology (e.g., different technology nodes such as 32 nm, 45 nm, and 90 nm, etc.), design specifications 940, characterization data 950, verification data 960, design rules 970, and test data files 985 (which may include, for example, standard circuit design processes such as timing analysis, verification, design rule checking, place and route operations, etc. One of ordinary skill in the art of integrated circuit design can appreciate the extent of possible electronic design automation tools and applications used in the design process 910 without deviating from the scope and spirit of the present invention. The design structure of the present invention is not limited to any specific design flow.

Design process 910 preferably translates an embodiment of the invention as shown in FIGS. 2-11, along with any additional integrated circuit deign or data (if applicable), into a second design structure 990. Design structure 990 resides on a storage medium in a data format used for the exchange of layout data of integrated circuits and/or symbolic data format (e.g., information stored in GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing though the manufacturing line, and any other data required by a semiconductor manufacturer to produce one of the embodiments of the present invention as shown in FIGS. 2-11. Design structure 990 may then proceed to a stage 995 where, for example, design structure 990 proceeds to tape-out, is released to manufacturing, is released to a mask house, is sent to another design house, is sent back to a customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   at least one semiconductor device located on a top surface of a semiconductor substrate;
   at least one first-level metal line separated from a top surface of said semiconductor substrate;
   a first dielectric layer abutting a top surface of said at least one first-level metal line;
   a conductive light shield located over said at least one semiconductor device and abutting a top surface of said first dielectric layer; and
   a second dielectric layer located over said conductive light shield, wherein said first dielectric layer and said second dielectric layer encapsulate an entirety of said conductive light shield.

2. The semiconductor structure of claim 1, further comprising:
   a second level metal line embedded in said second dielectric layer; and
   a contact via abutting a bottom surface of said at least one second level metal line and a top surface of said at least one first level metal line.

3. The semiconductor structure of claim 2, wherein said contact via is of integral construction without any physically manifested interface therein.

4. The semiconductor structure of claim 2, further comprising:
   a metal plate having a same material composition and a same thickness as said conductive light shield and abutting said top surface of said first dielectric layer and disjoined from said conductive light shield; and
   another contact via abutting a bottom surface of another second level metal line and a top surface of said metal plate.

5. The semiconductor structure of claim 4, further comprising yet another contact via abutting a bottom surface of yet another second level metal line and said top surface of said metal plate.

6. The semiconductor structure of claim 4, further comprising:
   a first metal plate having a same material composition as, and a same thickness as, said conductive light shield and abutting said top surface of said dielectric layer and disjoined from said conductive light shield;
   a first dielectric portion abutting a top surface of said conductive light shield and having sidewalls substantially vertically coincident with sidewalls of said conductive light shield;
   a second dielectric portion having a same material composition as, and a same thickness as, said first dielectric portion, abutting a top surface of said first metal plate, and disjoined from said first dielectric portion; and
   a second metal plate abutting a top surface of said second dielectric portion.

7. A design structure embodied in a machine readable medium for designing, manufacturing, or testing a design, said design structure comprising:
   a first data representing a semiconductor device on a semiconductor substrate;
   a second data representing a conductive light shield located in a local interconnect level and overlying said semiconductor device;
   a third data representing a metal line located in a metal interconnect level which is located above said local interconnect level; and
   a fourth data representing a contact via abutting said metal line and said semiconductor device.

8. The design structure of claim 7, wherein said contact via is of integral construction without any physically manifested interface therein.

9. The design structure of claim 7, further comprising:
   a fifth data representing a dielectric substrate-capping layer abutting a top surface of said semiconductor substrate and located underneath a portion of said conductive light shield; and
   a sixth data representing a middle-of-line (MOL) dielectric layer located over said dielectric substrate-capping layer and located underneath said at least one metal line.

10. The design structure of claim 9, further comprising another data representing a middle-of-line (MOL) dielectric liner layer abutting a top surface of said dielectric substrate-capping layer and a non-planar bottom surface of said conductive light shield.

11. The design structure of claim 7, wherein said fourth data includes another data representing at least one downward-protruding via portion located within said conductive light shield, wherein said at least one downward-protruding via portion vertically abuts a conductive structure located on said semiconductor substrate.

12. A design structure embodied in a machine readable medium for designing, manufacturing, or testing a design, said design structure comprising:
   a first data representing a semiconductor device located on a top surface of a semiconductor substrate;
   a second data representing a first-level metal line separated from a top surface of said semiconductor substrate;
   a third data representing a first dielectric layer abutting a top surface of said at least one first-level metal line;
   a fourth data representing a conductive light shield located over said at least one semiconductor device and abutting a top surface of said first dielectric layer; and
   a fifth data representing a second dielectric layer located over said conductive light shield, wherein said first dielectric layer and said second dielectric layer encapsulate an entirety of said conductive light shield.

13. The design structure of claim 12, further comprising:
   a sixth data representing a second-level metal line embedded in said second dielectric layer; and
   a seventh data representing a contact via abutting a bottom surface of said at least one second-level metal line and a top surface of said at least one first level metal line.

* * * * *